United States Patent
Sheydayi et al.

(10) Patent No.: US 7,494,107 B2
(45) Date of Patent: Feb. 24, 2009

(54) GATE VALVE FOR PLUS-ATMOSPHERIC PRESSURE SEMICONDUCTOR PROCESS VESSELS

(75) Inventors: Alexei Sheydayi, Gilbert, AZ (US); Thomas Sutton, Mesa, AZ (US)

(73) Assignee: Supercritical Systems, Inc., Gilbert, AZ (US)

(*) Notice: Subject to any disclaimer, the term of this patent is extended or adjusted under 35 U.S.C. 154(b) by 210 days.

(21) Appl. No.: 11/094,936

(22) Filed: Mar. 30, 2005

(65) Prior Publication Data

US 2006/0225811 A1    Oct. 12, 2006

(51) Int. Cl.
    *F16K 31/122* (2006.01)
(52) U.S. Cl. .................. 251/63.5; 251/175; 251/195; 414/935
(58) Field of Classification Search .......... 251/63.5, 251/175, 193, 195–202; 414/935, 939
    See application file for complete search history.

(56) References Cited

U.S. PATENT DOCUMENTS

| | | | |
|---|---|---|---|
| 2,617,719 A | 11/1952 | Stewart | |
| 2,625,886 A | 1/1953 | Browne | |
| 2,825,528 A * | 3/1958 | Truitt | 251/175 |
| 2,873,597 A | 2/1959 | Fahringer | |
| 3,521,765 A | 7/1970 | Kauffman et al. | |
| 3,524,467 A * | 8/1970 | Worley | 251/175 |
| 3,623,627 A | 11/1971 | Bolton | |
| 3,681,171 A | 8/1972 | Toku Hojo et al. | |
| 3,744,660 A | 7/1973 | Gaines et al. | |
| 3,968,885 A | 7/1976 | Hassan et al. | |
| 4,029,517 A | 6/1977 | Rand | |
| 4,091,643 A | 5/1978 | Zucchini | |
| 4,145,161 A | 3/1979 | Skinner | |
| 4,157,169 A * | 6/1979 | Norman | 251/195 |
| 4,244,557 A * | 1/1981 | Polhede et al. | 251/167 |
| 4,245,154 A | 1/1981 | Uehara et al. | |
| 4,316,750 A | 2/1982 | Gengler | 134/18 |
| 4,341,592 A | 7/1982 | Shortes et al. | |
| 4,343,455 A * | 8/1982 | Winkler | 251/195 |
| 4,355,937 A | 10/1982 | Mack et al. | |
| 4,367,140 A | 1/1983 | Wilson | |

(Continued)

FOREIGN PATENT DOCUMENTS

CN    1399790 A    2/2003

(Continued)

OTHER PUBLICATIONS

Hideaki Itakura et al., "Multi-Chamber Dry Etching System", Solid State Technology, Apr. 1982, pp. 209-214.

(Continued)

*Primary Examiner*—John Bastianelli
(74) *Attorney, Agent, or Firm*—Haverstock & Owens LLP

(57) ABSTRACT

An isolation valve is preferably applied to the semiconductor industry for sealing a process vessel and also operates effectively at plus-atmospheric pressures. A double containment gate valve assembly includes a housing and a movable head assembly within the housing. The housing includes a first access opening and a second access opening. The head assembly is configurable into a first position where an access path through the first and second access openings is clear, and a second position where the access path is blocked.

15 Claims, 8 Drawing Sheets

U.S. PATENT DOCUMENTS

| | | | |
|---|---|---|---|
| 4,381,100 A * | 4/1983 | Schoenberg | 251/195 |
| 4,391,511 A | 7/1983 | Akiyama et al. | |
| 4,406,596 A | 9/1983 | Budde | |
| 4,422,651 A | 12/1983 | Platts | |
| 4,426,358 A | 1/1984 | Johansson | |
| 4,474,199 A | 10/1984 | Blaudszun | |
| 4,522,788 A | 6/1985 | Sitek et al. | |
| 4,549,467 A | 10/1985 | Wilden et al. | |
| 4,574,184 A | 3/1986 | Wolf et al. | |
| 4,592,306 A | 6/1986 | Gallego | |
| 4,601,181 A | 7/1986 | Privat | |
| 4,618,769 A | 10/1986 | Johnson et al. | 250/338 |
| 4,626,509 A | 12/1986 | Lyman | |
| 4,670,126 A | 6/1987 | Messer et al. | |
| 4,682,937 A | 7/1987 | Credle, Jr. | |
| 4,693,777 A | 9/1987 | Hazano et al. | |
| 4,749,440 A | 6/1988 | Blackwood et al. | |
| 4,778,356 A | 10/1988 | Hicks | |
| 4,788,043 A | 11/1988 | Kagiyama et al. | |
| 4,789,077 A | 12/1988 | Noe | |
| 4,823,976 A | 4/1989 | White, III et al. | |
| 4,825,808 A | 5/1989 | Takahashi et al. | |
| 4,827,867 A | 5/1989 | Takei et al. | |
| 4,838,476 A | 6/1989 | Rahn | |
| 4,865,061 A | 9/1989 | Fowler et al. | |
| 4,879,431 A | 11/1989 | Bertoncini | |
| 4,917,556 A | 4/1990 | Stark et al. | |
| 4,924,892 A | 5/1990 | Kiba et al. | |
| 4,951,601 A | 8/1990 | Maydan et al. | |
| 4,960,140 A | 10/1990 | Ishijima et al. | |
| 4,983,223 A | 1/1991 | Gessner | |
| 5,009,738 A | 4/1991 | Gruenwald et al. | |
| 5,011,542 A | 4/1991 | Weil | |
| 5,028,219 A | 7/1991 | Schuetz et al. | 417/423.4 |
| 5,044,871 A | 9/1991 | Davis et al. | |
| 5,062,770 A | 11/1991 | Story et al. | |
| 5,071,485 A | 12/1991 | Matthews et al. | |
| 5,087,017 A * | 2/1992 | Sawa et al. | 251/175 |
| 5,105,556 A | 4/1992 | Kurokawa et al. | |
| 5,143,103 A | 9/1992 | Basso et al. | |
| 5,167,716 A | 12/1992 | Boitnott et al. | |
| 5,169,296 A | 12/1992 | Wilden | |
| 5,169,408 A | 12/1992 | Biggerstaff et al. | |
| 5,185,296 A | 2/1993 | Morita et al. | |
| 5,186,594 A | 2/1993 | Toshima et al. | |
| 5,186,718 A | 2/1993 | Tepman et al. | |
| 5,188,515 A | 2/1993 | Horn | |
| 5,190,373 A | 3/1993 | Dickson et al. | |
| 5,191,993 A | 3/1993 | Wanger et al. | |
| 5,193,560 A | 3/1993 | Tanaka et al. | |
| 5,195,878 A | 3/1993 | Sahiavo et al. | |
| 5,197,800 A * | 3/1993 | Saidman et al. | 137/3 |
| 5,213,485 A | 5/1993 | Wilden | |
| 5,217,043 A | 6/1993 | Novakovi | |
| 5,221,019 A | 6/1993 | Pechacek | |
| 5,222,876 A | 6/1993 | Budde | |
| 5,224,504 A | 7/1993 | Thompson et al. | |
| 5,236,669 A | 8/1993 | Simmons et al. | |
| 5,237,824 A | 8/1993 | Pawliszyn | |
| 5,240,390 A | 8/1993 | Kvinge et al. | |
| 5,242,641 A | 9/1993 | Horner et al. | 264/104 |
| 5,243,821 A | 9/1993 | Schuck et al. | |
| 5,246,500 A | 9/1993 | Samata et al. | |
| 5,251,776 A | 10/1993 | Morgan, Jr. et al. | |
| 5,252,041 A | 10/1993 | Schumack | |
| 5,259,731 A | 11/1993 | Dhindsa et al. | |
| 5,267,455 A | 12/1993 | Dewees et al. | |
| 5,280,693 A | 1/1994 | Heudecker | |
| 5,285,352 A | 2/1994 | Pastore et al. | |
| 5,285,845 A | 2/1994 | Östbo | 165/168 |
| 5,288,333 A | 2/1994 | Tanaka et al. | |
| 5,306,350 A | 4/1994 | Hoy et al. | |
| 5,313,965 A | 5/1994 | Palen | |
| 5,314,574 A | 5/1994 | Takahashi | |
| 5,328,722 A | 7/1994 | Ghanayem et al. | |
| 5,331,986 A | 7/1994 | Lim et al. | 134/88 |
| 5,337,446 A | 8/1994 | Smith et al. | |
| 5,339,844 A | 8/1994 | Sandford Jr, et al. | |
| 5,355,901 A | 10/1994 | Mielnik et al. | |
| 5,368,171 A | 11/1994 | Jackson | |
| 5,370,741 A | 12/1994 | Bergman | |
| 5,374,829 A | 12/1994 | Sakamoto et al. | |
| 5,377,705 A | 1/1995 | Smith, Jr. et al. | |
| 5,401,322 A | 3/1995 | Marshall | |
| 5,404,894 A | 4/1995 | Shiraiwa | |
| 5,412,958 A | 5/1995 | Iliff et al. | |
| 5,417,768 A | 5/1995 | Smith, Jr. et al. | |
| 5,433,334 A | 7/1995 | Reneau | |
| 5,434,107 A | 7/1995 | Paranjpe | 437/225 |
| 5,447,294 A | 9/1995 | Sakata et al. | |
| 5,474,410 A | 12/1995 | Ozawa et al. | |
| 5,494,526 A | 2/1996 | Paranjpe | |
| 5,503,176 A | 4/1996 | Dunmire et al. | |
| 5,505,219 A | 4/1996 | Lansberry et al. | |
| 5,509,431 A | 4/1996 | Smith, Jr. et al. | |
| 5,526,834 A | 6/1996 | Mielnik et al. | |
| 5,533,538 A | 7/1996 | Marshall | |
| 5,540,554 A | 7/1996 | Masuzawa | |
| 5,571,330 A | 11/1996 | Kyogoku | |
| 5,589,224 A | 12/1996 | Tepman et al. | |
| 5,621,982 A | 4/1997 | Yamashita et al. | |
| 5,629,918 A | 5/1997 | Ho et al. | |
| 5,644,855 A | 7/1997 | McDermott et al. | |
| 5,649,809 A | 7/1997 | Stapelfeldt | |
| 5,656,097 A | 8/1997 | Olesen et al. | |
| 5,669,251 A | 9/1997 | Townsend et al. | |
| 5,672,204 A | 9/1997 | Habuka | |
| 5,702,228 A | 12/1997 | Tamai et al. | |
| 5,706,319 A | 1/1998 | Holtz | |
| 5,746,008 A | 5/1998 | Yamashita et al. | |
| 5,769,588 A | 6/1998 | Toshima et al. | |
| 5,772,783 A | 6/1998 | Stucker | |
| 5,797,719 A | 8/1998 | James et al. | |
| 5,798,126 A | 8/1998 | Fijikawa et al. | |
| 5,817,178 A | 10/1998 | Mita et al. | |
| 5,850,747 A | 12/1998 | Roberts et al. | |
| 5,858,107 A | 1/1999 | Chao et al. | |
| 5,865,602 A | 2/1999 | Nozari | |
| 5,879,459 A | 3/1999 | Gadgil et al. | |
| 5,881,577 A | 3/1999 | Sauer et al. | |
| 5,882,165 A | 3/1999 | Maydan et al. | |
| 5,882,182 A | 3/1999 | Kato et al. | 417/366 |
| 5,888,050 A | 3/1999 | Fitzgerald et al. | |
| 5,898,727 A | 4/1999 | Fujikawa et al. | |
| 5,900,107 A | 5/1999 | Murphy et al. | |
| 5,904,737 A | 5/1999 | Preston et al. | |
| 5,906,866 A | 5/1999 | Webb | |
| 5,928,389 A | 7/1999 | Jevtic | |
| 5,932,100 A | 8/1999 | Yager et al. | |
| 5,934,856 A | 8/1999 | Asakawa et al. | |
| 5,934,991 A | 8/1999 | Rush | |
| 5,943,721 A | 8/1999 | Lerette et al. | |
| 5,946,945 A | 9/1999 | Kegler et al. | |
| 5,970,554 A | 10/1999 | Shore et al. | |
| 5,971,714 A | 10/1999 | Schaffer et al. | |
| 5,975,492 A | 11/1999 | Brenes | |
| 5,979,306 A | 11/1999 | Fujikawa et al. | |
| 5,980,648 A | 11/1999 | Adler | |
| 5,981,399 A | 11/1999 | Kawamura et al. | |
| 5,989,342 A | 11/1999 | Ikeda et al. | |
| 6,005,226 A | 12/1999 | Aschner et al. | |
| 6,010,315 A | 1/2000 | Kishimoto et al. | 417/228 |
| 6,017,820 A | 1/2000 | Ting et al. | |
| 6,029,371 A | 2/2000 | Kamikawa et al. | |

| | | | |
|---|---|---|---|
| 6,035,871 A | 3/2000 | Eui-Yeol | |
| 6,037,277 A | 3/2000 | Masakara et al. | |
| 6,041,817 A | 3/2000 | Guertin | |
| 6,045,331 A | 4/2000 | Gehm et al. | |
| 6,048,494 A | 4/2000 | Annapragada | |
| 6,053,348 A | 4/2000 | Morch | |
| 6,056,008 A | 5/2000 | Adams et al. | |
| 6,056,266 A * | 5/2000 | Blecha | 251/175 |
| 6,062,853 A | 5/2000 | Shimazu et al. | |
| 6,067,728 A | 5/2000 | Farmer et al. | |
| 6,070,440 A | 6/2000 | Malchow et al. | |
| 6,077,053 A | 6/2000 | Fujikawa et al. | |
| 6,077,321 A | 6/2000 | Adachi et al. | |
| 6,079,693 A * | 6/2000 | Ettinger et al. | 251/195 |
| 6,082,150 A | 7/2000 | Stucker | |
| 6,085,935 A | 7/2000 | Malchow et al. | |
| 6,089,377 A | 7/2000 | Shimizu | |
| 6,095,741 A * | 8/2000 | Kroeker et al. | 414/939 |
| 6,097,015 A | 8/2000 | McCullough et al. | |
| 6,103,638 A | 8/2000 | Robinson | 438/778 |
| 6,122,566 A | 9/2000 | Nguyen et al. | |
| 6,123,510 A | 9/2000 | Greer et al. | |
| 6,128,830 A | 10/2000 | Bettcher et al. | |
| 6,145,519 A | 11/2000 | Konishi et al. | |
| 6,159,295 A | 12/2000 | Maskara et al. | |
| 6,164,297 A | 12/2000 | Kamikawa | |
| 6,186,722 B1 | 2/2001 | Shirai | |
| 6,190,459 B1 | 2/2001 | Takeshita et al. | 118/715 |
| 6,203,582 B1 | 3/2001 | Berner et al. | |
| 6,216,364 B1 | 4/2001 | Tanaka et al. | |
| 6,221,781 B1 | 4/2001 | Siefering et al. | |
| 6,228,563 B1 | 5/2001 | Starov et al. | |
| 6,235,634 B1 | 5/2001 | White et al. | |
| 6,239,038 B1 | 5/2001 | Wen | |
| 6,241,825 B1 | 6/2001 | Wytman | |
| 6,244,121 B1 | 6/2001 | Hunter | |
| 6,251,250 B1 | 6/2001 | Keigler | |
| 6,264,003 B1 | 7/2001 | Dong et al. | 184/104.1 |
| 6,264,752 B1 | 7/2001 | Curtis et al. | |
| 6,264,753 B1 | 7/2001 | Chao et al. | |
| 6,277,753 B1 | 8/2001 | Mullee et al. | |
| 6,286,231 B1 | 9/2001 | Bergman et al. | |
| 6,302,372 B1 * | 10/2001 | Sauer et al. | 251/195 |
| 6,305,677 B1 | 10/2001 | Lenz | |
| 6,306,564 B1 | 10/2001 | Mullee | |
| 6,333,268 B1 | 12/2001 | Starov et al. | |
| 6,334,266 B1 | 1/2002 | Moritz | |
| 6,344,174 B1 | 2/2002 | Miller et al. | |
| 6,347,918 B1 * | 2/2002 | Blahnik | 251/195 |
| 6,355,072 B1 | 3/2002 | Racette et al. | |
| 6,358,673 B1 | 3/2002 | Namatsu | 430/311 |
| 6,363,292 B1 | 3/2002 | McLoughlin | |
| 6,388,317 B1 | 5/2002 | Reese | |
| 6,389,677 B1 | 5/2002 | Lenz | |
| 6,406,782 B2 | 6/2002 | Johnson et al. | |
| 6,418,956 B1 | 7/2002 | Bloom | |
| 6,427,973 B1 * | 8/2002 | Wagner | 251/175 |
| 6,431,185 B1 | 8/2002 | Tomita et al. | 134/1.3 |
| 6,436,824 B1 | 8/2002 | Chooi et al. | |
| 6,454,519 B1 | 9/2002 | Toshima et al. | |
| 6,454,945 B1 | 9/2002 | Weigl et al. | |
| 6,464,790 B1 | 10/2002 | Shertinsky et al. | |
| 6,497,239 B2 | 12/2002 | Farmer et al. | |
| 6,500,605 B1 | 12/2002 | Mullee et al. | 430/329 |
| 6,508,259 B1 | 1/2003 | Tseronis et al. | 134/105 |
| 6,509,141 B2 | 1/2003 | Mullee | 430/329 |
| 6,521,466 B1 | 2/2003 | Castrucci | |
| 6,532,772 B1 | 3/2003 | Robinson | 65/182.2 |
| 6,536,450 B1 | 3/2003 | Dolechek | 134/108 |
| 6,541,278 B2 | 4/2003 | Morita et al. | |
| 6,546,946 B2 | 4/2003 | Dunmire | |
| 6,550,484 B1 | 4/2003 | Gopinath et al. | |
| 6,558,475 B1 | 5/2003 | Jur et al. | |
| 6,561,213 B2 | 5/2003 | Wang et al. | |
| 6,561,220 B2 | 5/2003 | McCullough et al. | |
| 6,561,481 B1 | 5/2003 | Filonczuk | |
| 6,561,484 B2 * | 5/2003 | Nakagawa et al. | 251/175 |
| 6,561,767 B2 | 5/2003 | Biberger et al. | |
| 6,564,826 B2 | 5/2003 | Shen | |
| 6,596,093 B2 | 7/2003 | DeYoung et al. | |
| 6,612,317 B2 | 9/2003 | Costantini et al. | |
| 6,613,105 B1 | 9/2003 | Moore | 29/25.01 |
| 6,616,414 B2 | 9/2003 | Yoo et al. | |
| 6,641,678 B2 | 11/2003 | DeYoung et al. | |
| 6,642,140 B1 | 11/2003 | Moore | 438/631 |
| 6,722,642 B1 | 4/2004 | Sutton et al. | |
| 6,736,149 B2 | 5/2004 | Biberger et al. | |
| 6,764,212 B1 | 7/2004 | Nitta et al. | 366/114 |
| 6,764,552 B1 | 7/2004 | Joyce et al. | |
| 6,766,810 B1 | 7/2004 | Van Cleemput | 134/1.3 |
| 6,805,801 B1 | 10/2004 | Humayun et al. | |
| 6,815,922 B2 | 11/2004 | Yoo et al. | |
| 6,817,368 B2 | 11/2004 | Toshima et al. | 134/95.3 |
| 6,851,148 B2 | 2/2005 | Preston et al. | |
| 6,874,513 B2 | 4/2005 | Yamagata et al. | |
| 6,921,456 B2 | 7/2005 | Biberger et al. | |
| 6,966,967 B2 | 11/2005 | Curry et al. | |
| 2001/0050096 A1 | 12/2001 | Costantini et al. | |
| 2002/0001929 A1 | 1/2002 | Biberger | |
| 2002/0014257 A1 | 2/2002 | Chandra et al. | 134/19 |
| 2002/0046707 A1 | 4/2002 | Biberger et al. | |
| 2002/0144713 A1 | 10/2002 | Kuo et al. | 134/18 |
| 2002/0189543 A1 | 12/2002 | Biberger et al. | |
| 2003/0005948 A1 | 1/2003 | Matsuno et al. | |
| 2003/0029479 A1 | 2/2003 | Asano et al. | 134/18 |
| 2003/0036023 A1 | 2/2003 | Moreau et al. | |
| 2003/0051741 A1 | 3/2003 | DeSimone et al. | |
| 2003/0081206 A1 | 5/2003 | Doyl | 356/301 |
| 2003/0161734 A1 | 8/2003 | Kim | |
| 2003/0196679 A1 | 10/2003 | Cotte et al. | |
| 2003/0205510 A1 | 11/2003 | Jackson | |
| 2004/0020518 A1 | 2/2004 | DeYoung et al. | |
| 2004/0099604 A1 | 5/2004 | Hauck et al. | 210/656 |
| 2004/0103922 A1 | 6/2004 | Inoue et al. | 134/26 |
| 2004/0134515 A1 | 7/2004 | Castrucci | |
| 2004/0157463 A1 | 8/2004 | Jones | |
| 2004/0168709 A1 | 9/2004 | Drumm et al. | 134/18 |
| 2004/0211440 A1 | 10/2004 | Wang et al. | 134/2 |
| 2004/0213676 A1 | 10/2004 | Phillips et al. | |
| 2004/0221875 A1 | 11/2004 | Saga et al. | 134/26 |
| 2004/0245489 A1 * | 12/2004 | Kurita et al. | 251/195 |
| 2004/0255978 A1 | 12/2004 | Fury et al. | 134/18 |
| 2005/0014370 A1 | 1/2005 | Jones | |
| 2005/0026547 A1 | 2/2005 | Moore et al. | |
| 2005/0111987 A1 | 5/2005 | Yoo et al. | |
| 2005/0141998 A1 | 6/2005 | Yoo et al. | |
| 2005/0158178 A1 | 7/2005 | Yoo et al. | |
| 2005/0191184 A1 | 9/2005 | Vinson, Jr. | |
| 2006/0102204 A1 | 5/2006 | Jacobson et al. | 134/26 |
| 2006/0102208 A1 | 5/2006 | Jacobson et al. | 134/56 |
| 2006/0130966 A1 | 6/2006 | Babic et al. | |
| 2006/0177362 A1 | 8/2006 | D'Evelyn et al. | 422/245.1 |
| 2006/0180175 A1 | 8/2006 | Parent | 134/1.3 |

FOREIGN PATENT DOCUMENTS

| | | |
|---|---|---|
| DE | 36 08 783 A1 | 9/1987 |
| DE | 198 60 084 A1 | 7/2000 |
| EP | 0 244 951 A2 | 11/1987 |
| EP | 0 272 141 A2 | 6/1988 |
| EP | 0408216 A2 | 1/1991 |
| EP | 0 453 867 A1 | 10/1991 |
| EP | 0 572 913 A1 | 12/1993 |
| EP | 0 587 168 A1 | 3/1994 |
| EP | 0 679 753 B1 | 11/1995 |
| EP | 0 726 099 A2 | 8/1996 |

| | | |
|---|---|---|
| EP | 8-252549 | 10/1996 |
| EP | 0 743 379 A1 | 11/1996 |
| EP | 0822583 A2 | 2/1998 |
| EP | 0 903 775 A2 | 3/1999 |
| FR | 1.499.491 | 9/1967 |
| GB | 2 003 975 | 3/1979 |
| GB | 2 193 482 | 2/1988 |
| JP | 56-142629 | 11/1981 |
| JP | 60-238479 | 11/1985 |
| JP | 60-246635 | 12/1985 |
| JP | 61-017151 | 1/1986 |
| JP | 61-231166 | 10/1986 |
| JP | 62-111442 | 5/1987 |
| JP | 62-125619 | 6/1987 |
| JP | 63-179530 | 7/1988 |
| JP | 63-256326 | 10/1988 |
| JP | 63-303059 | 12/1988 |
| JP | 2-148841 | 6/1990 |
| JP | 2-209729 | 8/1990 |
| JP | 2-122520 | 10/1990 |
| JP | 03-080537 | 4/1991 |
| JP | 4-14222 | 1/1992 |
| JP | 4-17333 | 1/1992 |
| JP | 4-284648 | 10/1992 |
| JP | 5-283511 | 10/1993 |
| JP | 7-283104 | 10/1995 |
| JP | 8-186140 | 7/1996 |
| JP | 8-306632 | 11/1996 |
| JP | 9-43857 | 2/1997 |
| JP | 10-135170 | 5/1998 |
| JP | 10-144757 | 5/1998 |
| JP | 10-260537 | 9/1998 |
| JP | 10-335408 | 12/1998 |
| JP | 11-200035 | 7/1999 |
| JP | 11-204514 | 7/1999 |
| JP | 11-260809 | 9/1999 |
| JP | 11-274132 | 10/1999 |
| JP | 2000/106358 | 4/2000 |
| JP | 2001/77074 | 3/2001 |
| SE | 251213 | 8/1948 |
| WO | WO 87/07309 | 12/1987 |
| WO | WO 91/12629 | 8/1991 |
| WO | WO 99/18603 | 4/1999 |
| WO | WO 00/36635 | 6/2000 |
| WO | WO 01/10733 A1 | 2/2001 |
| WO | WO 01/22016 A1 | 3/2001 |
| WO | WO 01/33615 A3 | 5/2001 |
| WO | WO 01/55628 A1 | 8/2001 |
| WO | WO 01/68279 A2 | 9/2001 |
| WO | WO 01/74538 A1 | 10/2001 |
| WO | WO 01/78911 A1 | 10/2001 |
| WO | WO 01/85391 A2 | 11/2001 |
| WO | WO 01/94782 A3 | 12/2001 |
| WO | WO 02/09147 A2 | 1/2002 |
| WO | WO 02/16051 A2 | 2/2002 |
| WO | WO 02/084709 A2 | 10/2002 |
| WO | WO 03/030219 A2 | 10/2003 |

OTHER PUBLICATIONS

Sun, Y.P. et al., "Preparation of Polymer-Protected Semiconductor Nanoparticles Through the Rapid Expansion of Supercritical Fluid Solution," Chemical Physics Letters, pp. 585-588, May 22, 1998.

Dahmen, N. et al., "Supercritical Fluid Extraction of Grinding and Metal Cutting Watse Contaminated with Oils," Supercritical Fluids—Extraction and Pollution Prevention, ACS Symposium Series, vol. 670, pp. 270-279, Oct. 21, 1997.

Xu, C. et al., "Submicron-Sized Spherical Yttrium Oxide Based Phosphors Prepared by Supercritical CO2-Assisted aerosolization and pyrolysis," Appl. Phys. Lett., vol. 71, No. 12, Sep. 22, 1997, pp. 1643-1645.

Courtecuisse, V.G. et al., "Kinetics of the Titanium Isopropoxide Decomposition in Supercritical Isopropyl Alcohol," Ind. Eng. Chem. Res., vol. 35, No. 8, pp. 2539-2545, Aug. 1996.

Gallagher-Wetmore, P. et al., "Supercritical Fluid Processing: A New Dry Technique for Photoresist Developing," SPIE vol. 2438, pp. 694-708, Jun. 1995.

McHardy, J. et al., "Progress in Supercritical CO2 Cleaning," SAMPE Jour., vol. 29, No. 5, pp. 20-27, Sep. 1993.

Purtell, R, et al., "Precision Parts Cleaning Using Supercritical Fluids,"J. Vac, Sci, Technol. A. vol. 11, No. 4, Jul. 1993, pp. 1696-1701.

Hansen, B.N. et al., "Supercritical Fluid Transport—Chemical Deposition of Films"Chem. Mater., vol. 4, No. 4, pp. 749-752, 1992.

Hybertson, B.M. et al., "Deposition of Palladium Films by a Novel Supercritical Fluid Transport Chemical Deposition Process," Mat. Res. Bull., vol. 26, pp. 1127-113, 1991.

Ziger, D. H. et al., "Compressed Fluid Technology: Application to RIE-Developed Resists," AiChE Jour., vol. 33, No. 10, pp. 1585-1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298-2306, 1987.

Tolley, W.K. et al., "Stripping Organics from Metal and Mineral Surfaces using Supercritical Fluids," Separation Science and Technology, vol. 22, pp. 1087-1101, 1987.

Joseph L. Foszcz, "Diaphragm Pumps Eliminate Seal Problems", Plant Engineering, pp. 1-5, Feb. 1, 1996.

Bob Agnew, "Wilden Air-Operated Diaphragm Pumps", Process & Industrial Training Technologies, Inc., 1996.

* cited by examiner

GATE VALVE FOR PLUS-ATMOSPHERIC PRESSURE SEMICONDUCTOR PROCESS VESSELS

CROSS-REFERENCE TO RELATED APPLICATIONS

This patent application is related to commonly owned co-pending U.S. patent application Ser. No. 11/094,939, filed Mar. 30, 2005, entitled "METHOD OF TREATING A COMPOSITE SPIN-ON GLASS/ANTI-REFLECTIVE MATERIAL PRIOR TO CLEANING", U.S. patent application Ser. No. 11/094,876, filed Mar. 30, 2005, entitled "ISOTHERMAL CONTROL OF A PROCESS CHAMBER", U.S. patent application Ser. No. 11/094,938, filed Mar. 30, 2005, entitled "NEUTRALIZATION OF SYSTEMIC POISONING IN WAFER PROCESSING", U.S. patent application Ser. No. 11/094,882, filed Mar. 30, 2005, entitled "REMOVAL OF POROGENS AND POROGEN RESIDUES USING SUPERCRITICAL $CO_2$", U.S. patent application Ser. No. 11/095,827, filed Mar. 30, 2005, entitled "METHOD OF INHIBITING COPPER CORROSION DURING SUPERGRITICAL $CO_2$ CLEANING", U.S. patent application Ser. No. 11/065,636, filed Feb. 23, 2005, entitled "IMPROVED RINSING STEP IN SUPERCRITICAL PROCESSING", U.S. patent application Ser. No. 11/065,377, filed Feb. 23, 2005, entitled "IMPROVED CLEANING STEP IN SUPERCRITICAL PROCESSING", U.S. patent application Ser. No. 11/065,376, filed Feb. 23, 2005, entitled "ETCHING AND CLEANING BPSG MATERIAL USING SUPERCRITICAL PROCESSING", U.S. patent application Ser. No. 11/091,976, filed Mar. 28, 2005, entitled "HIGH PRESSURE FOURIER TRANSFORM INFRARED CELL", and U.S. patent application Ser. No. 11/092,232, filed Mar. 28, 2005, entitled "PROCESS FLOW THERMOCOUPLE", which are hereby incorporated by reference in its entirety.

FIELD OF THE INVENTION

The present invention relates to the field of micro-device manufacturing equipment and processing. More particularly, the present invention relates to the field of gate valves for pressure process vessels for semiconductor devices and micromachines.

BACKGROUND OF THE INVENTION

Semiconductor wafer processing typically is carried out at vacuum, or sub atmospheric pressure. As process parameters become more stringent, the industry is moving towards single wafer processing tools and away from batch processing of multiple wafers in a chemical bath. This requires that the processing chamber or vessel be opened and closed for every wafer that is cycled thru the tool. Gate valves that comprise an up/down motion, and some attempts at sideways motion, are currently state of the art. The side motion is limited at best, some manufacturers using pneumatic actuation, others using cams, or just a slight angle orientation of the up/down axis to the chamber face to move a gate valve head into intimate contact with the processing chamber. Many gate valves seal internally to the valve assembly, the seal to the process chamber being an additional seal point.

Once the vacuum pumps are turned on in the process chamber, the area of the gate valve exposed to vacuum on the process chamber side and standard atmospheric conditions on the other side translate into a force directed from the higher pressure side of the gate valve to the lower pressure side of the pressure chamber. This force assists to compress the seal between the gate valve and the chamber (or gate valve internal sealing face). In a sense, the seal between the gate valve and the process chamber becomes sealed by the process being performed in the chamber. In this case, the pressure in the process chamber is lowered or brought to a vacuum, referred to as negative pressure.

Some newly developed processes for wafers operate at pressures higher than atmosphere. Conventional gate valves will not operate in such systems, as the process pressure will prevent the gate valve from sealing. Some processes, such as these operating under high-pressure conditions will cause a dangerous operating environment if conventional gate valves are used. Conventional gate valves will not operate in such systems.

There exists a need for a gate valve that operates in a positive pressure environment, which is a process in which the pressure within the process chamber is increased.

SUMMARY OF THE INVENTION

In one aspect of the present invention, a load and containment apparatus includes a process chamber including a first access opening. A gate valve assembly coupled to close the process chamber. The gate valve assembly includes a second access opening, a third access opening. A movable head assembly is configurable into a first position where an access path through the first, second, and third access openings is clear, and a second position where the access path is blocked. The first access opening of the process chamber can be coupled to the second access opening of the gate valve assembly. When the head assembly is in the second position, the first access opening of the process chamber and the third access opening of the gate valve assembly can be sealed closed. The first, second, and third access openings can be configured as a linear path. The head assembly can move in a direction perpendicular to the plane of the first, second, and third access openings. The head assembly can include two doors, each door movable in a direction of the linear path, a first door facing the third access opening and a second door facing the second access opening. The head assembly can further comprise a first piston coupled to the first door, a second piston coupled to the second door, and a pressure cavity configured in between the first and second pistons. The head assembly can further comprise an access hole to the pressure cavity. The first piston and the second piston can each include two-rod, double acting cylinders. The first piston and the second piston can each comprise a single cylinder.

In another aspect of the present invention, a method of loading and locking a process chamber includes coupling the process chamber which has a first access opening to a gate valve assembly, a second access opening, a third access opening, and a movable head assembly. The first access opening is adjacent the second access opening. The first, second, and third access openings form a linear access path. The head assembly is moved into a first position to clear the access path through the gate valve assembly to the process chamber. The head assembly is moved into a second position to block the access path through the gate valve assembly to the process chamber. While in the second position, the method can further include moving a first door of the head assembly along a direction of the access path to seal the third access opening and moving a second door of the head assembly along the direction of the access path to seal the first access opening. Sealing the third access opening can comprise forcing a first surface of the first door against a gate valve assembly housing surrounding the third access opening. The method can also include sealing the first door against the gate valve assembly housing using an o-ring coupled the first door. Prior to moving the head assembly into the second position, the method can include moving the first door away from the third access opening and moving the second door away from the first access opening. Sealing the second door to the first access opening can comprise forcing a second surface of the second door against an outer surface of the process chamber surrounding the first access opening. The method can further comprise coupling the first door to a first piston, coupling the second door to a second piston, and configuring a pressure cavity between the first piston and the second piston. Moving the first door to seal the third access opening and moving the second door to seal the first access opening can comprise increasing the pressure within the pressure cavity. Increasing the pressure within the pressure cavity can comprise providing fluid into the pressure cavity through an access hole leading through the head assembly into the pressure cavity. The pressure within the pressure cavity can be increased to within a range of about 1 psig to about 10,000 psig. The method can further comprise moving the first door along the access path away from the third access opening and moving the second door along the access path away from the first access opening. Moving the first door away from the third access opening and moving the first door away from the first access opening can comprise decreasing the pressure within the pressure cavity and increasing the pressure on a first surface of the first piston and a second surface of the second piston. Decreasing the pressure within the pressure cavity can comprise removing fluid from the pressure cavity through an access hole leading through the head assembly into the pressure cavity. Increasing the pressure outside the first surface of the first piston and the second surface of the second piston can comprise providing a fluid that can include air, gas, or a hydraulic fluid to an area inside the head assembly different than the pressure cavity by one or more fittings. The head assembly can move in a direction perpendicular to the linear access path.

In yet another aspect of the present invention, a double containment gate valve assembly includes a housing with a first access opening and a second access opening, and a movable head assembly within the housing. The head assembly is configurable into a first position where an access path through the first and second access openings is clear, and a second position where the access path is blocked. The second access opening of the gate valve assembly can be coupled to a third access opening of process chamber. When the head assembly is in the second position, the third access opening of the process chamber and the first access opening of the gate valve assembly can be sealed closed. The access path can form a linear path through the first, second, and third access openings. The head assembly can move in a direction perpendicular to the linear path. The head assembly can include two doors. Each door is movable in a direction of the access path. A first door faces the first access opening and a second door faces the second access opening. The head assembly can further comprise a first piston coupled to the first door, a second piston coupled to the second door, and a pressure cavity configured in between the first and second pistons. The head assembly can further comprise an access hole to the pressure cavity. The first piston and the second piston can each include two-rod, double acting cylinders. The first piston and the second piston can each comprise a single cylinder.

BRIEF DESCRIPTION OF THE DRAWINGS

A more complete appreciation of various embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

In one embodiment, the methods and apparatus in accordance with the present invention utilize the low viscosity and solvating and solubilizing properties of supercritical carbon dioxide to assist in supercritical processing. For purposes of the invention, "carbon dioxide" should be understood to refer to carbon dioxide ($CO_2$) employed as a fluid in a liquid, gaseous or supercritical pressure (including near supercritical pressure) state. "Supercritical carbon dioxide" refers herein to $CO_2$ at conditions above the critical temperature (30.3° C.) and critical pressure (7.38 MPa). When $CO_2$ is subjected to pressures and temperatures above 7.38 MPa and 30.3° C., respectively, it is determined to be in the supercritical pressure state. "Near-supercritical pressure carbon dioxide" refers to $CO_2$ within about 85% of absolute critical temperature and critical pressure.

A wide variety of materials can be effectively processed using the methods and apparatus of the invention. For example, a substrate can comprise a low-k material, or an ultra-low-k material, or a combination thereof. The methods and apparatus of the invention are particularly advantageous for the processing materials having thicknesses up to approximately 2.0 microns and having critical dimensions below approximately 0.25 microns.

In another embodiment, the invention can be directed to an apparatus and methods of processing a substrate using high pressure ozone processing.

Figure 1:
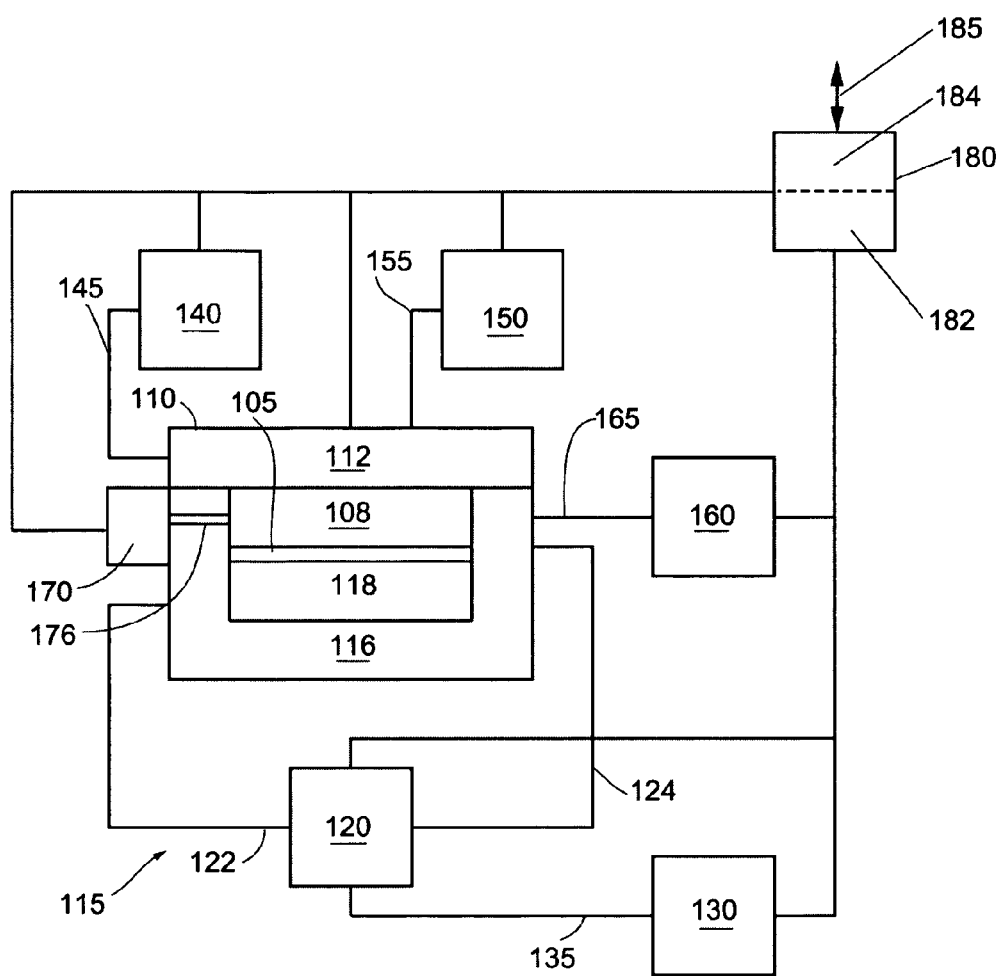
FIG. 1 shows an exemplary block diagram of a processing system in accordance with an embodiment of the invention.

FIG. 1 shows an exemplary block diagram of a processing system in accordance with an embodiment of the invention. In the illustrated embodiment, processing system 100 comprises a process module 110, a recirculation system 120, a process chemistry supply system 130, a high-pressure fluid supply system 140, a pressure control system 150, an exhaust system 160, a gate valve assembly 170, and a controller 180. The processing system 100 can operate at pressures that can range from 1000 psi. to 10,000 psi. In addition, the processing system 100 can operate at temperatures that can range from 40 to 300 degrees Celsius.

The details concerning one example of a processing chamber are disclosed in co-owned and co-pending U.S. patent application Ser. No. 09/912,844, entitled "HIGH PRESSURE PROCESSING CHAMBER FOR SEMICONDUCTOR SUBSTRATE," filed Jul. 24, 2001, Ser. No. 09/970,309, entitled "HIGH PRESSURE PROCESSING CHAMBER FOR MULTIPLE SEMICONDUCTOR SUBSTRATES," filed Oct. 3, 2001, Ser. No. 10/121,791, entitled "HIGH PRESSURE PROCESSING CHAMBER FOR SEMICONDUCTOR SUBSTRATE INCLUDING FLOW ENHANCING FEATURES," filed Apr. 10, 2002, and Ser. No. 10/364,284, entitled "HIGH-PRESSURE PROCESSING CHAMBER FOR A SEMICONDUCTOR WAFER," filed Feb. 10, 2003, the contents of which are incorporated herein by reference.

The controller 180 can be coupled to the process module 110, the recirculation system 120, the process chemistry supply system 130, the high-pressure fluid supply system 140, the pressure control system 150, the exhaust system 160, and the gate valve assembly 170. Alternately, controller 180 can be coupled to one or more additional controllers/computers (not shown), and controller 180 can obtain setup, configuration, and/or recipe information from an additional controller/computer.

In FIG. 1, singular processing elements (110, 120, 130, 140, 150, 160, 170, and 180) are shown, but this is not required for the invention. The semiconductor processing system 100 can comprise any number of processing elements having any number of controllers associated with them in addition to independent processing elements.

The controller 180 can be used to configure any number of processing elements (110, 120, 130, 140, 150, 160, and 170), and the controller 180 can collect, provide, process, store, and display data from processing elements. The controller 180 can comprise a number of applications for controlling one or more of the processing elements. For example, controller 180 can include a GUI component (not shown) that can provide easy to use interfaces that enable a user to monitor and/or control one or more processing elements.

The process module 110 can include an upper assembly 112 and a lower assembly 116, and the upper assembly 112 can be coupled to the lower assembly 116. In an alternate embodiment, a frame and or injection ring may be included and may be coupled to an upper assembly and a lower assembly. The upper assembly 112 can comprise a heater (not shown) for heating the process chamber, the substrate, or the processing fluid, or a combination of two or more thereof. Alternately, a heater is not required in the upper assembly 112. In another embodiment, the lower assembly 116 can comprise a heater (not shown) for heating the process chamber, the substrate, or the processing fluid, or a combination of two or more thereof. The process module 110 can include means for flowing a processing fluid through the processing chamber 108. In one example, a circular flow pattern can be established, and in another example, a substantially linear flow pattern can be established. Alternately, the means for flowing can be configured differently. The lower assembly 116 can comprise one or more lifters (not shown) for moving the chuck 118 and/or the substrate 105. Alternately, a lifter is not required.

In one embodiment, the process module 110 can include a holder or chuck 118 for supporting and holding the substrate 105 while processing the substrate 105. The holder or chuck 118 can also be configured to heat or cool the substrate 105 before, during, and/or after processing the substrate 105. Alternately, the process module 110 can include a platen for supporting and holding the substrate 105 while processing the substrate 105.

The processing system 100 can include a gate valve assembly 170 and a slot 176 for providing access to the processing chamber 108 during substrate transfer operations. The gate valve assembly 170 can be used along with a transfer system (not shown) to move a substrate into and out of the processing chamber 108 through a slot (not shown) in the chamber wall. In one example, the slot can be opened and closed by moving the chuck, and in another example, the slot can be controlled using another gate valve assembly (not shown).

The substrate can include semiconductor material, metallic material, dielectric material, ceramic material, or polymer material, or a combination of two or more thereof. The semiconductor material can include Si, Ge, Si/Ge, or GaAs. The metallic material can include Cu, Al, Ni, Pb, Ti, Ta, or W, or combinations of two or more thereof. The dielectric material can include Si, O, N, or C, or combinations of two or more thereof. The ceramic material can include Al, N, Si, C, or O, or combinations of two or more thereof.

The recirculation system 120 can be coupled to the process module 110 using one or more inlet lines 122 and one or more outlet lines 124. The recirculation system 120 can comprise one or more valves (not shown) for regulating the flow of a high-pressure processing solution through the recirculation system 120 and through the process module 110. The recirculation system 120 can comprise any number of back-flow valves, filters, pumps, and/or heaters (not shown) for maintaining a high pressure processing solution and flowing the process solution through the recirculation system 120 and through the processing chamber 108 in the process module 110.

Processing system 100 can comprise a chemistry supply system 130. In the illustrated embodiment, the chemistry supply system 130 is coupled to the recirculation system 120 using one or more lines 135, but this is not required for the invention. In alternate embodiments, the chemical supply system 130 can be configured differently and can be coupled to different elements in the processing system. For example, the chemistry supply system 130 can be coupled to the process module 110.

The process chemistry is introduced by the process chemistry supply system 130 into the fluid introduced by the high-pressure fluid supply system 140 at ratios that vary with the substrate properties, the chemistry being used, and the process being performed in the processing chamber 110. The ratio can vary from approximately 0.001 to approximately 15 percent by volume. For example, when the recirculation loop 115 comprises a volume of about one liter, the process chemistry volumes can range from approximately ten micro liters to approximately one hundred fifty milliliters. In alternate embodiments, the volume and/or the ratio may be higher or lower.

The chemistry supply system 130 can comprise pre-treating chemistry assemblies (not shown) for providing pre-treating chemistry for generating pre-treating solutions within the processing chamber. The pre-treating chemistry can include a high polarity solvent. For example, alcohols, organic acids, and inorganic acids that can be introduced into supercritical carbon dioxide or another high-pressure fluid with one or more carrier solvents, such as water or alcohols (such a methanol, ethanol, and 1-propanol).

The chemistry supply system 130 can comprise a rinsing chemistry assembly (not shown) for providing rinsing chemistry for generating supercritical and/or high-pressure rinsing solutions within the processing chamber. The rinsing chemistry can include one or more organic solvents including, but not limited to, alcohols and ketones. In one embodiment, the rinsing chemistry can comprise an alcohol and a carrier solvent. The chemistry supply system 130 can comprise a drying chemistry assembly (not shown) for providing drying chemistry for generating supercritical and/or high-pressure drying solutions within the processing chamber.

In addition, the process chemistry can include chelating agents, complexing agents, oxidants, organic acids, and inorganic acids that can be introduced into supercritical and/or high pressure carbon dioxide with one or more carrier solvents, such as N,N-dimethylacetamide (DMAc), gamma-butyrolactone (BLO), dimethyl sulfoxide (DMSO), ethylene carbonate (EC), N-methylpyrrolidone (NMP), dimethylpiperidone, propylene carbonate, and alcohols (such a methanol, ethanol and 1-propanol).

Furthermore, the process chemistry can include solvents, co-solvents, surfactants, and/or other ingredients. Examples of solvents, co-solvents, and surfactants are disclosed in co-owned U.S. Pat. No. 6,500,605, entitled "REMOVAL OF PHOTORESIST AND RESIDUE FROM SUBSTRATE USING SUPERCRITICAL CARBON DIOXIDE PROCESS", issued Dec. 31, 2002, and U.S. Pat. No. 6,277,753, entitled "REMOVAL OF CMP RESIDUE FROM SEMICONDUCTORS USING SUPERCRITICAL CARBON DIOXIDE PROCESS", issued Aug. 21, 2001, both are incorporated by reference herein. The processing system 100 can comprise a high-pressure fluid supply system 140. As shown in FIG. 1, the high-pressure fluid supply system 140 can be coupled to the process module 110 using one or more lines 145, but this is not required. The inlet line 145 can be equipped with one or more back-flow valves, and/or heaters (not shown) for controlling the fluid flow from the high-pressure fluid supply system 140. In alternate embodiments, high-pressure fluid supply system 140 can be configured differently and coupled differently. For example, the high-pressure fluid supply system 140 can be coupled to the recirculation system 120.

The high-pressure fluid supply system 140 can comprise a carbon dioxide source (not shown) and a plurality of flow control elements (not shown) for generating a supercritical and/or high-pressure fluid. For example, the carbon dioxide source can include a $CO_2$ feed system, and the flow control elements can include supply lines, valves, filters, pumps, and heaters. The high-pressure fluid supply system 140 can comprise an inlet valve (not shown) that is configured to open and close to allow or prevent the stream of supercritical and/or high-pressure carbon dioxide from flowing into the processing chamber 108. For example, controller 180 can be used to determine fluid parameters such as pressure, temperature, process time, and flow rate.

The processing system 100 can also comprise a pressure control system 150. As shown in FIG. 1, the pressure control system 150 can be coupled to the process module 110 using one or more lines 155, but this is not required. Line 155 can be equipped with one or more back-flow valves, and/or heaters (not shown) for controlling the fluid flow to pressure control system 150. In alternate embodiments, pressure control system 150 can be configured differently and coupled differently. The pressure control system 150 can include one or more pressure valves (not shown) for exhausting the processing chamber 108 and/or for regulating the pressure within the processing chamber 108. Alternately, the pressure control system 150 can also include one or more pumps (not shown). For example, one pump may be used to increase the pressure within the processing chamber, and another pump may be used to evacuate the processing chamber 108. In another embodiment, the pressure control system 150 can comprise means for sealing the processing chamber. In addition, the pressure control system 150 can comprise means for raising and lowering the substrate and/or the chuck.

Furthermore, the processing system 100 can comprise an exhaust control system 160. As shown in FIG. 1, the exhaust control system 160 can be coupled to the process module 110 using one or more lines 165, but this is not required. Line 165 can be equipped with one or more back-flow valves, and/or heaters (not shown) for controlling the fluid flow to the exhaust control system 160. In alternate embodiments, exhaust control system 160 can be configured differently and coupled differently. The exhaust control system 160 can include an exhaust gas collection vessel (not shown) and can be used to remove contaminants from the processing fluid. Alternately, the exhaust control system 160 can be used to recycle the processing fluid.

In one embodiment, controller 180 can comprise a processor 182 and a memory 184. Memory 184 can be coupled to processor 182, and can be used for storing information and instructions to be executed by processor 182. Alternately, different controller configurations can be used. In addition, controller 180 can comprise a port 185 that can be used to couple processing system 100 to another system (not shown). Furthermore, controller 180 can comprise input and/or output devices (not shown).

In addition, one or more of the processing elements (110, 120, 130, 140, 150, 160, and 180) may include memory (not shown) for storing information and instructions to be executed during processing and processors for processing information and/or executing instructions. For example, the memory may be used for storing temporary variables or other intermediate information during the execution of instructions by the various processors in the system. One or more of the processing elements can comprise the means for reading data and/or instructions from a computer readable medium. In addition, one or more of the processing elements can comprise the means for writing data and/or instructions to a computer readable medium.

Memory devices can include at least one computer readable medium or memory for holding computer-executable instructions programmed according to the teachings of the invention and for containing data structures, tables, records, or other data described herein. Controller 180 can use pre-process data, process data, and post-process data. For example, pre-process data can be associated with an incoming substrate. This pre-process data can include lot data, batch data, run data, composition data, and history data. The pre-process data can be used to establish an input state for a wafer. Process data can include process parameters. Post processing data can be associated with a processed substrate.

The processing system 100 can perform a portion or all of the processing steps of the invention in response to the controller 180 executing one or more sequences of one or more computer-executable instructions contained in a memory. Such instructions may be received by the controller from another computer, a computer readable medium, or a network connection.

Stored on any one or more of a combination of computer readable media, the present invention includes software for controlling the processing system 100, for driving a device or devices for implementing the invention, and for enabling the processing system 100 to interact with a human user and/or another system, such as a factory system. Such software may include, but is not limited to, device drivers, operating systems, development tools, and applications software. Such computer readable media further includes the computer program product of the present invention for performing all or a portion (if processing is distributed) of the processing performed in implementing the invention.

The term "computer readable medium" as used herein refers to any medium that participates in providing instructions to a processor for execution and/or that participates in storing information before, during, and/or after executing an instruction. A computer readable medium may take many forms, including but not limited to, non-volatile media, volatile media, and transmission media. The term "computer-executable instruction" as used herein refers to any computer code and/or software that can be executed by a processor, that provides instructions to a processor for execution and/or that participates in storing information before, during, and/or after executing an instruction.

Controller 180, processor 182, memory 184 and other processors and memory in other system elements as described thus far can, unless indicated otherwise below, be constituted by components known in the art or constructed according to principles known in the art. The computer readable medium and the computer executable instructions can also, unless indicated otherwise below, be constituted by components known in the art or constructed according to principles known in the art.

Controller 180 can use port 185 to obtain computer code and/or software from another system (not shown), such as a factory system. The computer code and/or software can be used to establish a control hierarchy. For example, the processing system 100 can operate independently, or can be controlled to some degree by a higher-level system (not shown).

The controller 180 can use data from one or more of the system components to determine when to alter, pause, and/or stop a process. The controller 180 can use the data and operational rules to determine when to change a process and how to change the process, and rules can be used to specify the action taken for normal processing and the actions taken on exceptional conditions. Operational rules can be used to determine which processes are monitored and which data is used. Rules can be used to determine how to manage the data when a process is changed, paused, and/or stopped. In general, rules allow system and/or tool operation to change based on the dynamic state of the system. For example, rules can be used to determine whether to open or close the gate valve assembly when the process is altered, paused, and/or stopped.

Controller 180 can receive, send, use, and/or generate pre-process data, process data, and post-process data, and this data can include lot data, batch data, run data, composition data, and history data. Pre-process data can be associated with an incoming substrate and can be used to establish an input state for a substrate and/or a current state for a process module. Process data can include process parameters. Post processing data can be associated with a processed substrate and can be used to establish an output state for a substrate.

The controller 180 can use the pre-process data to predict, select, or calculate a set of process parameters to use to process the substrate. The pre-process data can include data describing the substrate to be processed. For example, the pre-process data can include information concerning the substrate's materials, the number of layers, the materials used for the different layers, the thickness of materials in the layers, the size of vias and trenches, and a desired process result. The pre-process data can be used to determine a process recipe and/or process model. A process model can provide the relationship between one or more process recipe parameters and one or more process results. A process recipe can include a multi-step process involving a set of process modules. Post-process data can be obtained at some point after the substrate has been processed. For example, post-process data can be obtained after a time delay that can vary from minutes to days.

The controller can compute a predicted state for the substrate based on the pre-process data, the process characteristics, and a process model. For example, a process model can be used along with a material type and thickness to compute a predicted process time. In addition, a rinse rate model can be used along with a residue type and amount to compute a processing time for a rinse process. The controller can use the process time to determine the operating state for the gate valve assembly.

In one embodiment, the substrate can comprise at least one of a semiconductor material, a metallic material, a polysilicon material, and a photoresist material. For example, the photoresist material can include photoresist and/or photoresist residue. One process recipe can include steps for removing residues from patterned or un-patterned low-k material. Another process recipe can include steps for removing the photoresist material, and/or removing the residues.

It will be appreciated that the controller 180 can perform other functions in addition to those discussed here. The controller 180 can monitor the pressure, temperature, flow, or other variables associated with the processing system 100 and take actions based on these values. For example, the controller 180 can process measured data, display data and/or results on a GUI screen, determine a fault condition, determine a response to a fault condition, and alert an operator. The controller 180 can comprise a database component (not shown) for storing input and output data.

Figure 2:
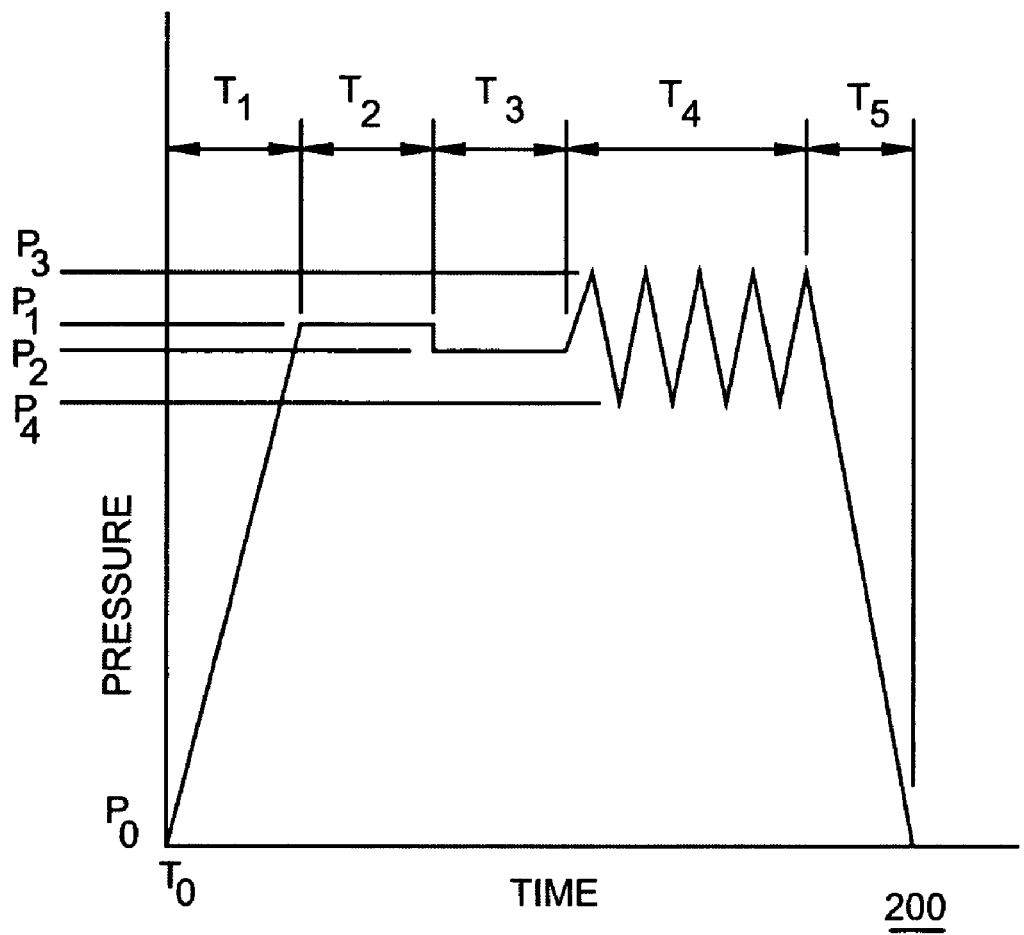
FIG. 2 illustrates exemplary graph of pressure versus time for a high pressure process in accordance with embodiments of the invention.

FIG. 2 illustrates an exemplary graph of pressure versus time for a process step in accordance with an embodiment of the invention. In the illustrated embodiment, a graph 200 of pressure versus time is shown, and the graph 200 can be used to represent a supercritical cleaning process step, a supercritical rinsing process step, or a supercritical curing process step, or a combination thereof. In an alternate embodiment, the processing chamber can be configured for ozone processing and the graph 200 can be used to represent a process step that includes ozone. In other embodiments, different pressures, different timing, and different sequences may be used for different processes.

Prior to an initial time $T_0$, the substrate to be processed can be placed within the processing chamber 108, and the processing chamber 108 can be sealed. For example, the gate valve assembly 170 can be opened and a transfer mechanism (not shown) can be used to position the substrate within the processing chamber. After the substrate has been positioned in the processing chamber, the gate valve assembly 170 can be closed, thereby sealing the processing chamber and allowing the required processing pressures to be established in the processing chamber.

For example, during cleaning and/or rinsing processes, a substrate can have post-etch and/or post-ash residue thereon can be used. The substrate, the processing chamber, and the other elements in the recirculation loop 115 (FIG. 1) can be heated to an operational temperature. For example, the operational temperature can range from 40 to 300 degrees Celsius. For example, the processing chamber 108, the recirculation system, and piping coupling the recirculation system to the processing chamber can form a recirculation loop.

From the initial time $T_0$ through a first duration of time $T_1$, the elements in the recirculation loop 115 can be pressurized. During a first portion of the time $T_1$, a temperature-controlled fluid can be provided into the recirculation loop 115. In one embodiment, the high-pressure fluid supply system 140 can be operated during a pressurization process and can be used to fill the recirculation loop with temperature-controlled fluid. The high-pressure fluid supply system 140 can comprise means for filling the recirculation loop with the temperature-controlled fluid, and the temperature variation of the temperature-controlled fluid can be controlled to be less than approximately ten degrees Celsius during the pressurization process. Alternately, the temperature variation of the temperature-controlled fluid can be controlled to be less than approximately five degrees Celsius during the pressurization process. In alternate embodiments, the high-pressure fluid supply system 140 and/or the pressure control system 150 can be operated during a pressurization process and can be used to fill the recirculation loop with temperature-controlled fluid.

For example, a supercritical fluid, such as substantially pure $CO_2$, can be used to pressurize the elements in the recirculation loop 115. During time $T_1$, a pump (not shown) in the recirculation system 120 can be started and can be used to circulate the temperature controlled fluid through the processing chamber 108 and the other elements in the recirculation loop 115. During time $T_1$, the gate valve assembly 170 can remain closed, thereby sealing the processing chamber and allowing high pressures to be established in the processing chamber.

In one embodiment, when the pressure in the processing chamber 108 reaches an operational pressure Po (approximately 2,500 psi), process chemistry can be injected into the processing chamber 108, using the process chemistry supply system 130. In an alternate embodiment, process chemistry can be injected into the processing chamber 108, using the process chemistry supply system 130 when the pressure in the processing chamber 108 exceeds a critical pressure Pc (1,070 psi). In other embodiments, process chemistry may be injected into the processing chamber 108 before the pressure exceeds the critical pressure Pc (1,070 psi) using the process chemistry supply system 130. In other embodiments, process chemistry is not injected during the T1 period.

In one embodiment, process chemistry is injected in a linear fashion, and the injection time can be based on a recirculation time. For example, the recirculation time can be determined based on the length of the recirculation path and the flow rate. In other embodiments, process chemistry may be injected in a non-linear fashion. For example, process chemistry can be injected in one or more steps.

The process chemistry can include a cleaning agent, a rinsing agent, or a curing agent, or a combination thereof that is injected into the processing fluid. One or more injections of process chemistries can be performed over the duration of time $T_1$ to generate a processing solution with the desired concentrations of chemicals. The process chemistry, in accordance with the embodiments of the invention, can also include one more or more carrier solvents.

When dielectric material is being treated, the process chemistry can include a passivating agent and a solvent that is injected into the processing fluid. The processing chemistry preferably includes hexamethyldisilazane (HMDS), chlorotrimethylsilane (TMCS), trichloromethylsilane (TMCS) and combinations thereof. The processing chemistry can also include one or more carrier solvents.

In an alternate embodiment, the processing chamber can be configured for ozone processing and the processing fluid may include ozone.

Still referring to both FIGS. 1 and 2, during a second time $T_2$, the processing solution can be re-circulated over the substrate and through the processing chamber 108 using the recirculation system 120, such as described above. In one embodiment, the process chemistry supply system 130 can be switched off, and process chemistry is not injected during the second time $T_2$. Alternatively, the process chemistry supply system 130 may be switched on one or more times during $T_2$, and process chemistry may be injected into the processing chamber 108 during the second time $T_2$ or after the second time $T_2$.

In one embodiment, the processing chamber 108 and the gate valve assembly 170 can operate at a pressure above 1,500 psi during the second time $T_2$. For example, the pressure can range from approximately 2,500 psi to approximately 3,100 psi, but can be any value so long as the operating pressure is sufficient to maintain supercritical conditions.

The processing solution is circulated over the substrate and through the processing chamber 108 using the recirculation system 120, such as described above. The correct processing conditions within the processing chamber 108 and the other elements in the recirculation loop 115 are maintained during the second time $T_2$, and the processing solution continues to be circulated over the substrate and through the processing chamber 108 and the other elements in the recirculation loop 115. The recirculation system 120, can be used to regulate the flow of the processing solution through the processing chamber 108 and the other elements in the recirculation loop 115.

In an alternate embodiment, the processing chamber can be configured for ozone processing and the processing chamber 108 and the gate valve assembly 170 can operate at a pressure below 1,000 psi during the second time $T_2$.

Still referring to both FIGS. 1 and 2, during a third time $T_3$, one or more push-through processes can be performed. In one embodiment, the high-pressure fluid supply system 140 can be operated during a push-through process and can be used to fill the recirculation loop with temperature-controlled fluid. The high-pressure fluid supply system 140 can comprise means for providing a first volume of temperature-controlled fluid during a push-through process, and the first volume can be larger than the volume of the recirculation loop. Alternately, the first volume can be less than or approximately equal to the volume of the recirculation loop. In addition, the temperature differential within the first volume of temperature-controlled fluid during the push-through process can be controlled to be less than approximately ten degrees Celsius. Alternately, the temperature variation of the temperature-controlled fluid can be controlled to be less than approximately five degrees Celsius during a push-through process.

In other embodiments, the high-pressure fluid supply system 140 can comprise means for providing one or more volumes of temperature controlled fluid during a push-through process; each volume can be larger than the volume of the processing chamber or the volume of the recirculation loop; and the temperature variation associated with each volume can be controlled to be less than ten degrees Celsius.

For example, during the third time $T_3$, one or more volumes of temperature controlled supercritical carbon dioxide can be fed into the processing chamber 108 and the other elements in the recirculation loop 115 from the high-pressure fluid supply system 140, and the supercritical cleaning solution along with process residue suspended or dissolved therein can be displaced from the processing chamber 108 and the other elements in the recirculation loop 115 through the exhaust control system 160. During time $T_3$, the gate valve assembly 170 can remain closed, thereby sealing the processing chamber and allowing the push-through process to be performed.

In an alternate embodiment, the processing chamber can be configured for ozone processing and the processing solution along with process residue suspended or dissolved therein can be displaced from the processing chamber.

Providing temperature-controlled fluid during the push-through process prevents process residue suspended or dissolved within the fluid being displaced from the processing chamber 108 and the other elements in the recirculation loop 115 from dropping out and/or adhering to the processing chamber 108 and the other elements in the recirculation loop 115. In addition, during the third time $T_3$, the temperature of the fluid supplied by the high-pressure fluid supply system 140 can vary over a wider temperature range than the range used during the second time $T_2$.

In the illustrated embodiment shown in FIG. 2, a single second time $T_2$ is followed by a single third time $T_3$, but this is not required. In alternate embodiments, other time sequences may be used to process a substrate.

In an alternate embodiment, the processing chamber can be configured for ozone processing and a push-through process may not be required.

After the push-through process is complete, a pressure cycling process can be performed. Alternately, one or more pressure cycles can occur during the push-through process. In other embodiments, a pressure cycling process is not required. During a fourth time $T_4$, the processing chamber 108 can be cycled through a plurality of decompression and compression cycles. The pressure can be cycled between a first pressure $P_3$ and a second pressure $P_4$ one or more times. In alternate embodiments, the first pressure $P_3$ and a second pressure $P_4$ can vary. In one embodiment, the pressure can be lowered by venting through the exhaust control system 160. For example, this can be accomplished by lowering the pressure to below approximately 1,500 psi and raising the pressure to above approximately 2,500 psi. The pressure can be increased by using the high-pressure fluid supply system 140 and/or the pressure control system 150 to provide additional high-pressure fluid.

The high-pressure fluid supply system 140 and/or the pressure control system 150 can comprise means for providing a first volume of temperature-controlled fluid during a compression cycle, and the first volume can be larger than the volume of the recirculation loop. Alternately, the first volume can be less than or approximately equal to the volume of the recirculation loop. In addition, the temperature differential within the first volume of temperature-controlled fluid during the compression cycle can be controlled to be less than approximately 10 degrees Celsius. Alternately, the temperature variation of the temperature-controlled fluid can be controlled to be less than approximately five degrees Celsius during a compression cycle.

In addition, the high-pressure fluid supply system 140 and/or the pressure control system 150 can comprise means for providing a second volume of temperature-controlled fluid during a decompression cycle, and the second volume can be larger than the volume of the recirculation loop. Alternately, the second volume can be less than or approximately equal to the volume of the recirculation loop. In addition, the temperature differential within the second volume of temperature-controlled fluid during the decompression cycle can be controlled to be less than approximately 10 degrees Celsius. Alternately, the temperature variation of the temperature-controlled fluid can be controlled to be less than approximately five degrees Celsius during a decompression cycle.

In other embodiments, the high-pressure fluid supply system 140 and/or the pressure control system 150 can comprise means for providing one or more volumes of temperature controlled fluid during a compression cycle and/o decompression cycle; each volume can be larger than the volume of the processing chamber or the volume of the recirculation loop; the temperature variation associated with each volume can be controlled to be less than ten degrees Celsius; and the temperature variation can be allowed to increase as additional cycles are performed.

Furthermore, during the fourth time $T_4$, one or more volumes of temperature controlled supercritical carbon dioxide can be fed into the processing chamber 108 and the other elements in the recirculation loop 115, and the supercritical cleaning solution along with process residue suspended or dissolved therein can be displaced from the processing chamber 108 and the other elements in the recirculation loop 115 through the exhaust control system 160. In an alternate embodiment, supercritical carbon dioxide can be fed into the recirculation system 120, and the supercritical cleaning solution along with process residue suspended or dissolved therein can also be displaced from the processing chamber 108 and the other elements in the recirculation loop 115 through the exhaust control system 160.

Providing temperature-controlled fluid during the pressure cycling process prevents process residue suspended or dissolved within the fluid being displaced from the processing chamber 108 and the other elements in the recirculation loop 115 from dropping out and/or adhering to the processing chamber 108 and the other elements in the recirculation loop 115. In addition, during the fourth time $T_4$, the temperature of the fluid supplied can vary over a wider temperature range than the range used during the second time $T_2$.

In an alternate embodiment, the processing chamber can be configured for ozone processing and a pressure cycling process may not be required. For example, the processing pressure may be established using a processing gas that includes ozone.

In the illustrated embodiment shown in FIG. 2, a single third time $T_3$ is followed by a single fourth time $T_4$, but this is not required. In alternate embodiments, other time sequences may be used to process a substrate.

In an alternate embodiment, the exhaust control system 160 can be switched off during a portion of the fourth time $T_4$. For example, the exhaust control system 160 can be switched off during a compression cycle.

During a fifth time $T_5$, the processing chamber 108 can be returned to lower pressure. For example, after the pressure cycling process is completed, then the processing chamber can be vented or exhausted to atmospheric pressure.

The high-pressure fluid supply system 140 and/or the pressure control system 150 can comprise means for providing a volume of temperature-controlled fluid during a venting process, and the volume can be larger than the volume of the recirculation loop. Alternately, the volume can be less than or approximately equal to the volume of the recirculation loop. In addition, the temperature differential within the volume of temperature-controlled fluid during the venting process can be controlled to be less than approximately twenty degrees Celsius. Alternately, the temperature variation of the temperature-controlled fluid can be controlled to be less than approximately 15 degrees Celsius during a venting process.

Providing temperature-controlled fluid during the venting process prevents process residue suspended or dissolved within the fluid being displaced from the processing chamber 108 and the other elements in the recirculation loop 115 from dropping out and/or adhering to the processing chamber 108 and the other elements in the recirculation loop 115.

In the illustrated embodiment shown in FIG. 2, a single fourth time $T_4$ is followed by a single fifth time $T_5$, but this is not required. In alternate embodiments, other time sequences may be used to process a substrate.

In one embodiment, during a portion of the fifth time $T_5$, the recirculation pump (not shown) can be switched off. In addition, the temperature of the fluid supplied can vary over a wider temperature range than the range used during the second time $T_2$. For example, the temperature can range below the temperature required for supercritical operation.

In an alternate embodiment, the processing chamber can be configured for ozone processing and a processing pressure is established during the fifth time $T_5$ using a processing gas that includes ozone.

For substrate processing, the chamber pressure can be made substantially equal to the pressure inside of a transfer chamber (not shown) coupled to the processing chamber. For example, the gate valve assembly 170 can be opened and a transfer mechanism (not shown) can be used to remove the substrate from the processing chamber. In one embodiment, the substrate can be moved from the processing chamber into the transfer chamber, and moved to a second process apparatus or module to continue processing.

In the illustrated embodiment shown in FIG. 2, the pressure returns to an initial pressure $P_0$, but this is not required for the invention. In alternate embodiments, the pressure does not have to return to $P_0$, and the process sequence can continue with additional time steps such as those shown in time steps $T_1$, $T_2$, $T_3$, $T_4$, or $T_5$.

The graph 200 is provided for exemplary purposes only. For example, a substrate can be cleaned/rinsed/treated using one to ten processing steps each taking less than approximately three minutes, as described above. It will be understood by those skilled in the art that a processing step can have any number of different time/pressures or temperature profiles without departing from the scope of the invention. Further, any number of cleaning, rinsing, and/or curing process sequences with each step having any number of compression and decompression cycles are contemplated. In addition, as stated previously, concentrations of various chemicals and species within a processing solution can be readily tailored for the application at hand and altered at any time within a processing step.

Figure 3:
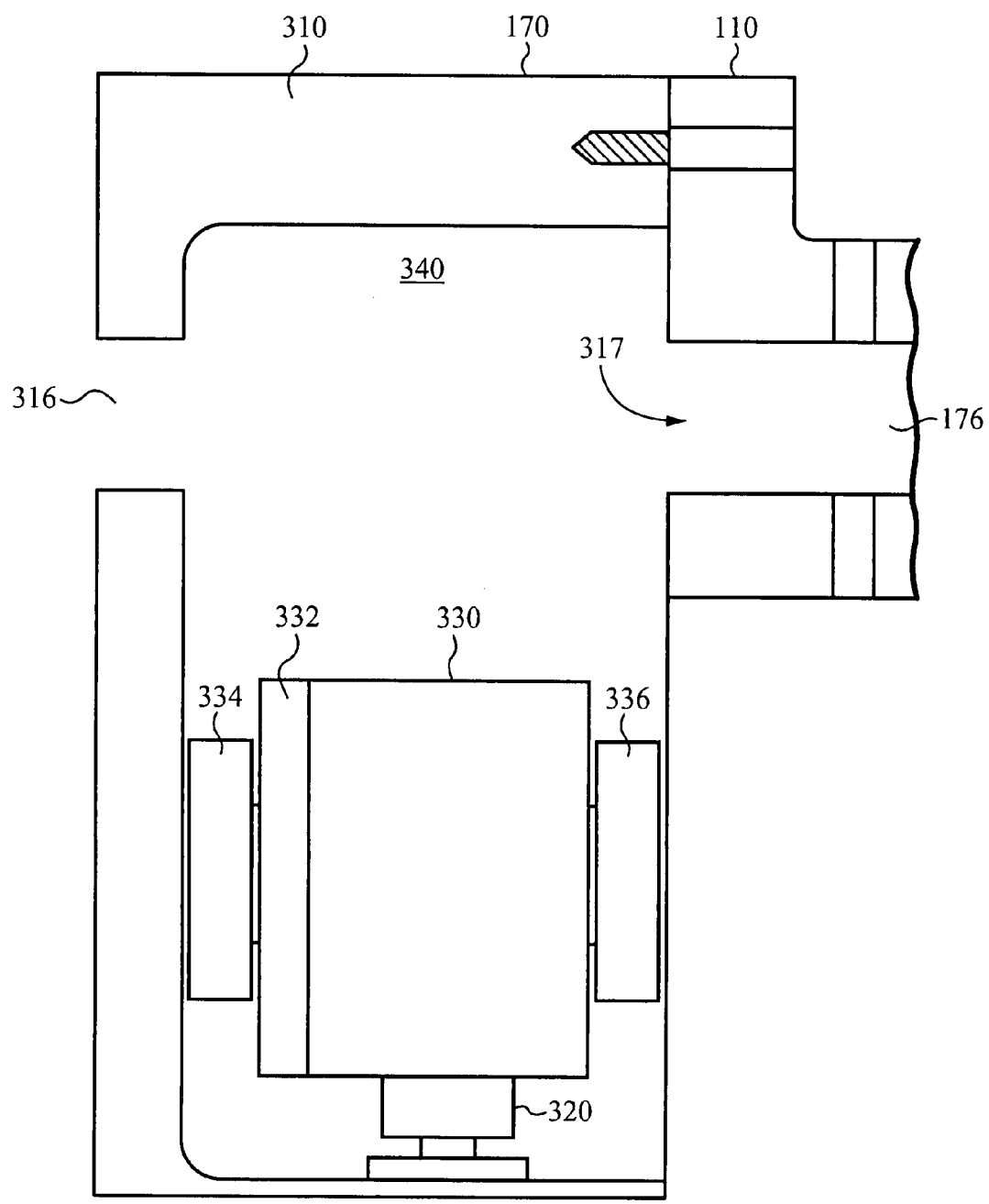
FIG. 3 shows a simplified schematic of a gate valve assembly in a first configuration in accordance with embodiments of the invention.

FIG. 3 shows a simplified schematic of a gate valve assembly in a first configuration in accordance with embodiments of the invention. In the illustrated embodiment, the gate valve assembly 170 is shown in a first configuration. The gate valve assembly 170 includes a housing 310, a head assembly 330, and a head cylinder 320. The head cylinder 320 is coupled to the head assembly 330 to move the head assembly 330 up and down within an inner chamber 340. As illustrated, the head assembly 330 is in the down position.

The housing 310 includes an outer access opening 316 and an inner access opening 317. The gate valve assembly 170 is coupled to the processing chamber 108 (FIG. 1) such that the inner access opening 317 of the gate valve assembly 170 is aligned with the access opening 176 in the wall of the processing module 110 (FIG. 1). The outer access opening 316 is configured to be substantially in the same horizontal plane as the inner access opening 317 and the access opening 176, thereby providing an access pass through the inner chamber 340 of the gate valve assembly 170 when the head assembly 330 is in the down position, as shown in FIG. 3.

The gate valve assembly 170 can be coupled to a wafer handler (not shown) such that the outer access opening 316 functions as a wafer load/unload slot, typically serviced by a robot arm associated with the wafer handler. In the down configuration, the gate valve assembly 170 enables a wafer to be loaded/unloaded to/from the processing chamber 108 via the access path through the outer access opening 316 and the inner access opening 317. In one embodiment, the head assembly 330 retracts down to clear the access path through the gate valve assembly 170, to minimize particulates from the gate valve assembly, which may accumulate over time, from falling on the wafer during loading/unloading. In an alternative embodiment, the gate valve assembly 170 is configured such that the head assembly 330 moves in a horizontal direction relative to the access path, for example perpendicular to the plane of FIG. 3, in order to clear the access path.

The head assembly 330 includes a first door 334 and a second door 336. The first door 334 and the second door 336 are movable in a direction parallel to the access path. As shown in FIG. 3, the first door 334 and the second door 336 are in a retracted position, such that neither door touches the inner side of the gate valve housing 310 or an outer side of the processing chamber 108.

Figure 4:
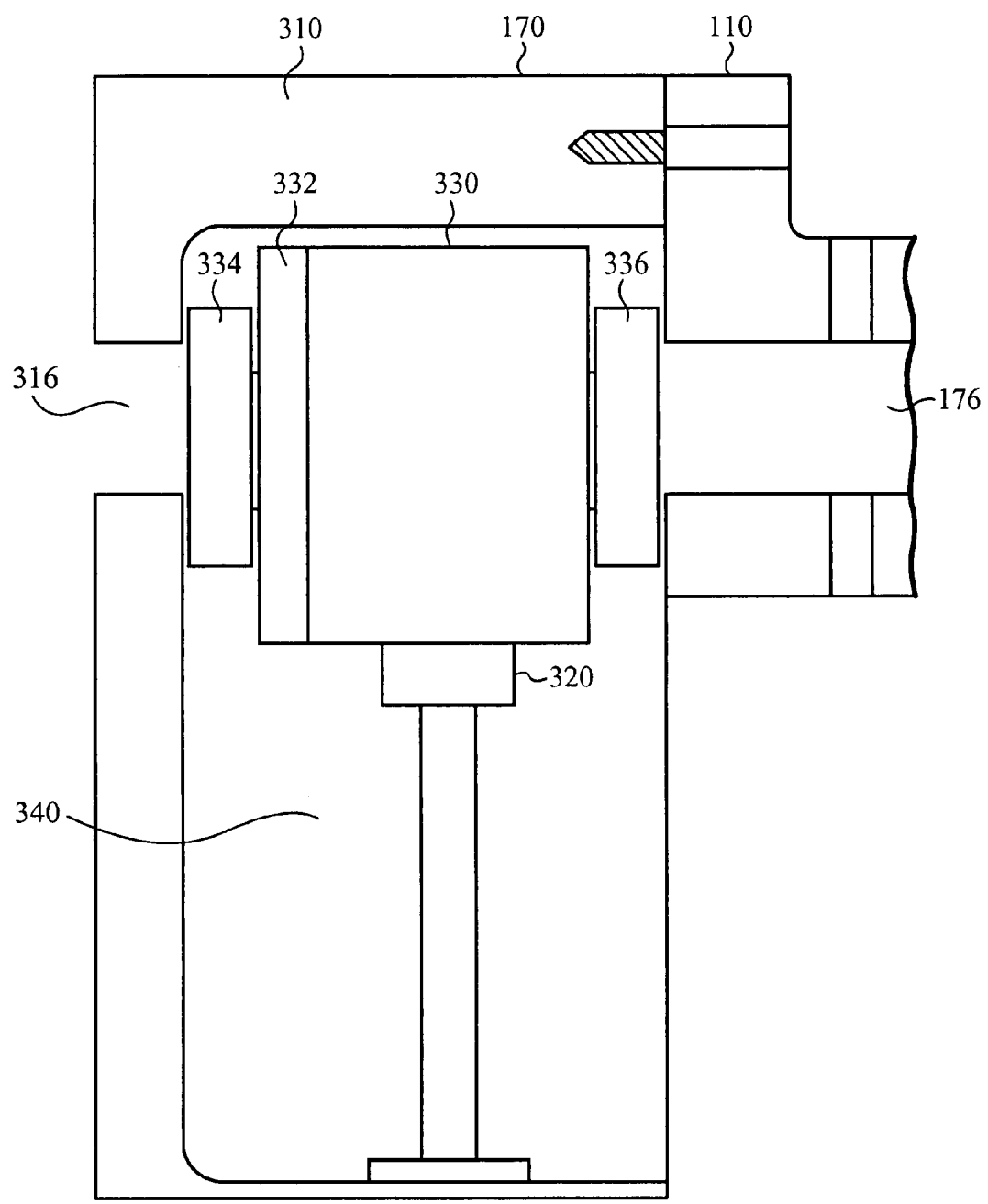
FIG. 4 shows a simplified schematic of the gate valve assembly in a second configuration, in accordance with embodiments of the invention.

FIG. 4 shows a simplified schematic of a gate valve assembly in a second configuration in accordance with embodiments of the invention. In the illustrated embodiment, the gate valve assembly 170 is shown in an up configuration. To move from the down position in FIG. 3 to the up position in FIG. 4, the head cylinder 320 is actuated. While the head cylinder 320 is actuated, the first door 334 and the second door 336 remain in the retracted position. In the up position, the head assembly 330 effectively blocks the access path through the gate valve assembly 170. However, while the first door 334 and the second door 336 are in the retracted position, the outer access opening 316 and the inner access opening 317 are not sealed.

Figure 5:
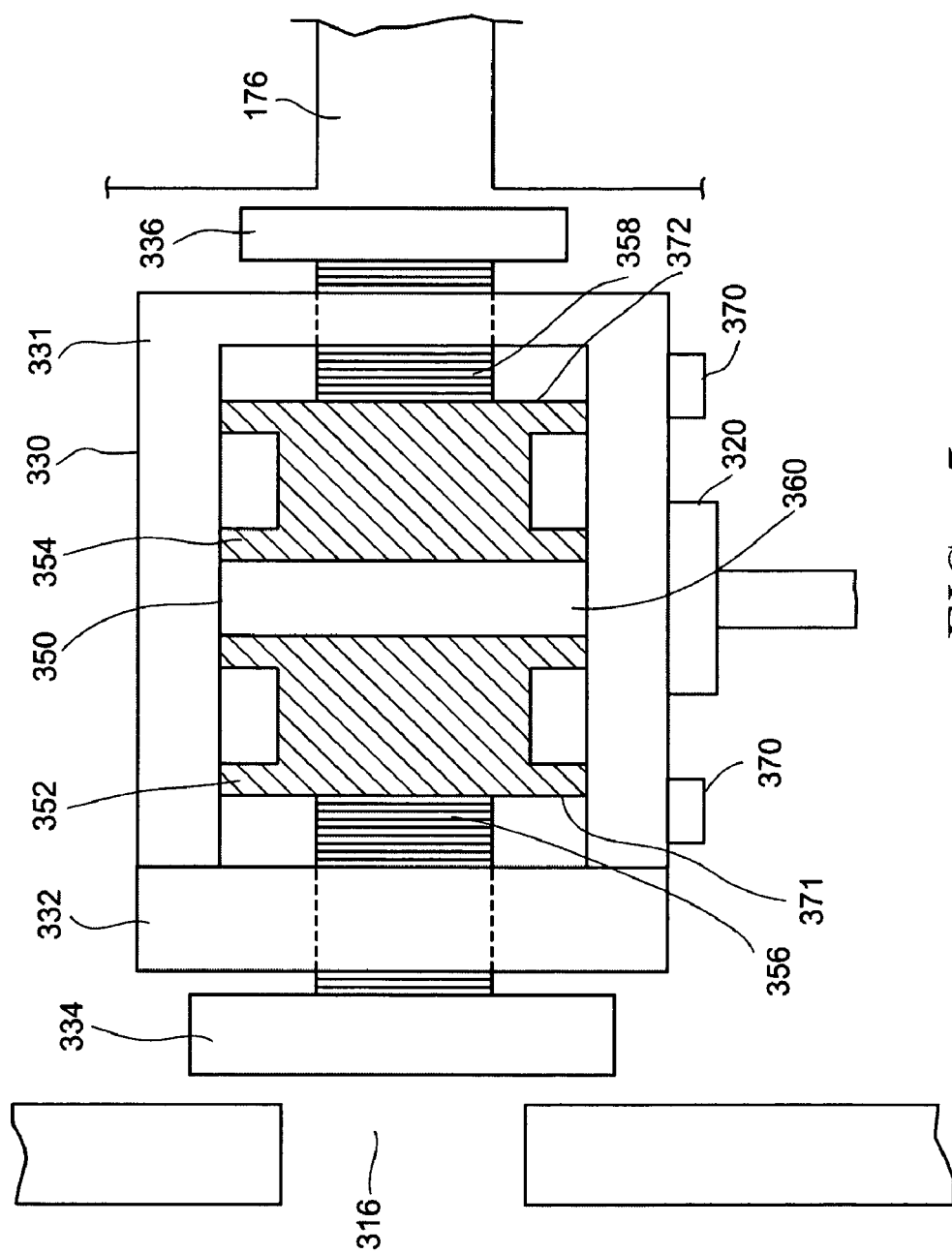
FIG. 5 shows a simplified schematic of the gate valve assembly in a third configuration in accordance with embodiments of the invention.

FIG. 5 shows a simplified schematic of a gate valve assembly in a third configuration in accordance with embodiments of the invention. In the illustrated embodiment, the gate valve assembly 170 is shown with the head assembly 330 in the up configuration and the first door 334 and the second door 336 in the retracted position. As shown in FIG. 5, in the up position, the first door 334 is aligned with the outer access opening 316 and the second door 336 is aligned with the access opening 176 of the processing chamber 108. The head assembly 330 includes a head assembly housing 331 and a closure plate 332. The head assembly housing 331 is configured to form a head inner chamber 350. The head assembly housing 331 preferably encloses the head inner chamber 350 an all but one open side. The closure plate 332 is coupled to the head assembly housing 331 at the open side of the head inner chamber 350, thereby enclosing the head inner chamber 350.

The head assembly 330 also includes a first piston 352 and a second piston 354 configured within the inner head chamber 350. The first piston 352 is coupled to a cylinder 356. The cylinder 356 is coupled to the first door 334 by passing thru an access hole (not shown), also referred to as a pass-thru, in the closure plate 332. The second piston 354 is coupled to a cylinder 358. The cylinder 358 is coupled to the second door 336 by passing thru a pass-thru (not shown) in the head assembly housing 331. The first piston 352 and the second piston 354 are separated by an fluid gap 360.

Fittings 370 are coupled to access openings drilled into the head assembly housing 331 that transmit pressure to an outside face 371 of the first piston 352 and an outside face 372 of the second piston 354. Additionally, one or more fittings (not shown) can be coupled to access openings leading to the fluid gap 360. Applying pressure to the outside faces 371 and 372, and removing pressure from the fluid gap 360, moves the first and second pistons 353 and 354 towards each other, and away from the outer access opening 316 and the access opening 176. In an alternate embodiment, one or more springs (not shown) may be configured within the fluid gap to facilitate piston movement.

Pressure can be supplied to the fluid gap 360 between the two pistons 352 and 354, and removed from the outside faces 371 and 372 of the two pistons. Pressurizing in this manner causes the pistons 352 and 354 to be forced equally outward, and hence the attached doors 334 and 336 are moved outwards. In this manner, the pistons 352 and 354 operate as pneumatically actuated pistons. It is understood that other actuation methods are anticipated by the present invention including, but not limited to hydraulic or solenoid. In another alternate embodiment, one or more springs (not shown) may be coupled to one or more of the outside faces 371 and 372 of the two pistons to facilitate piston movement.

Figure 6:
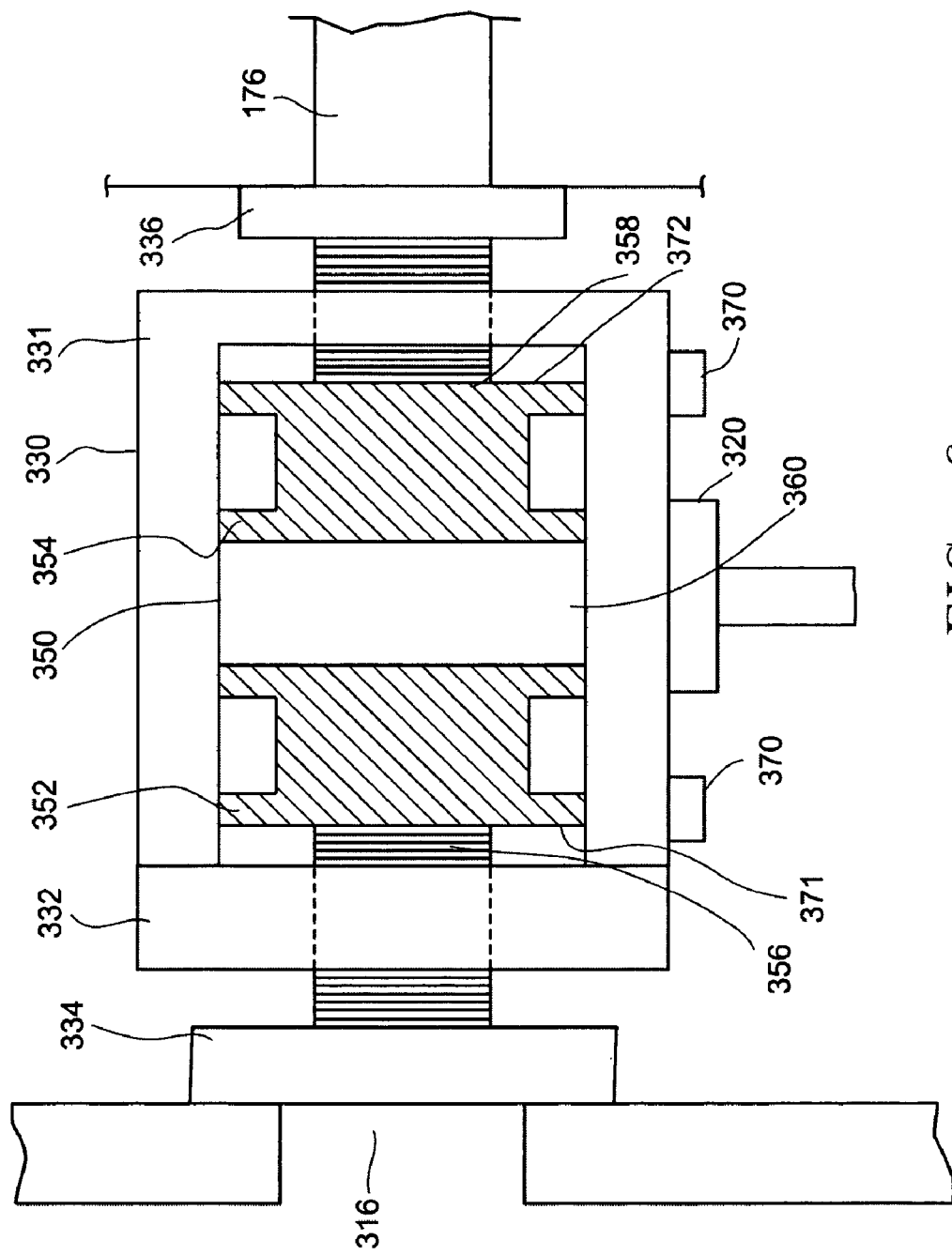
FIG. 6 shows a simplified schematic of the gate valve assembly in a fourth configuration in accordance with embodiments of the invention.

FIG. 6 shows a simplified schematic of a gate valve assembly in a fourth configuration in accordance with embodiments of the invention. In the illustrated embodiment, a partial view of the gate valve assembly 170 is shown in which the head assembly 330 is illustrated with the doors 334 and 336 in an extended position. In this condition, the doors 334 and 336 compress and create a temporary seal around both the process chamber access opening 176 and the outer access opening 316. A surface of the first door 334 facing the outer access opening 316 and a surface of the second door 336 facing the access opening 176 each include an integrated door seal, preferably an o-ring, which improves the seal around the access openings. An advantage of this arrangement is that any pressure which is applied inside the process chamber is translated onto the process side of the second door 336, then to the second piston 354, then to the medium (fluid gap 360) under pressure in the gate valve head assembly 330, then to the opposite first piston 352, and then to the outer first door 334. Such a design provides an added safety feature.

Not shown are the containment areas on a semiconductor processing tool that includes the gate valve assembly of the present invention. In most cases, a wafer handling robot that load/unloads wafers into/from the processing chamber via the gate valve assembly is not in a protected area, but the internal components of the semiconductor processing tool are enclosed in an exhausted cabinet. In the case of toxic gases being employed, this is an important distinction. With proper enclosure design, the gate valve assembly design of the present invention will force the outer door 334 shut even tighter during an overpressure event in the process chamber 108. Any leak from the process chamber 108 which may overcome the pressure inside the head assembly 330 of the gate valve assembly 170 holding the doors 334 and 336 "expanded", will leak into the inside of the semiconductor process tool (which includes inner chamber 340), which is typically exhausted and will duct away hazardous materials. Also not show, a pressure switch is preferably coupled to the fluid gap 360 that indicates loss of pressure, which in turn indicates a loss of holding power to the pistons 352, 354 and doors 334, 336.

To load another wafer into the processing chamber, the pressure applied to the expanded doors 334 and 336 is reversed, the doors 334 and 336 move in, and the up/down head cylinder 320 is activated to lower the head assembly 330 out of the wafer access path. The up/down head cylinder 320 is an off-the-shelf commercial double acting cylinder, of no special design or arrangement. A magnetic reed switch can be employed on the head cylinder 320 to indicate the head assembly 330 has reached the down position. Additionally, a safety switch can be added to the gate valve assembly 170, which is activated by the presence of the head assembly 330 in the up position.

In one embodiment, the gate valve assembly is configured to operate for pressures in the processing chamber in about the range of 1000 psi. to 10,000 psi. The doors of the head assembly are preferably constructed of 316 stainless steel for strength and corrosion resistance. The doors can be coated on the process side for added resistance. The pistons within the head assembly are preferably steel for strength reasons. The cylinders connecting the pistons to the doors are preferably steel for wear reasons. The head assembly housing and the closure plate are each preferably aluminum. The gate valve assembly housing is preferably aluminum. Alternatively, the materials described above can be replaced with any other materials sufficient to maintain operation of the gate valve assembly described herein.

Figure 7:
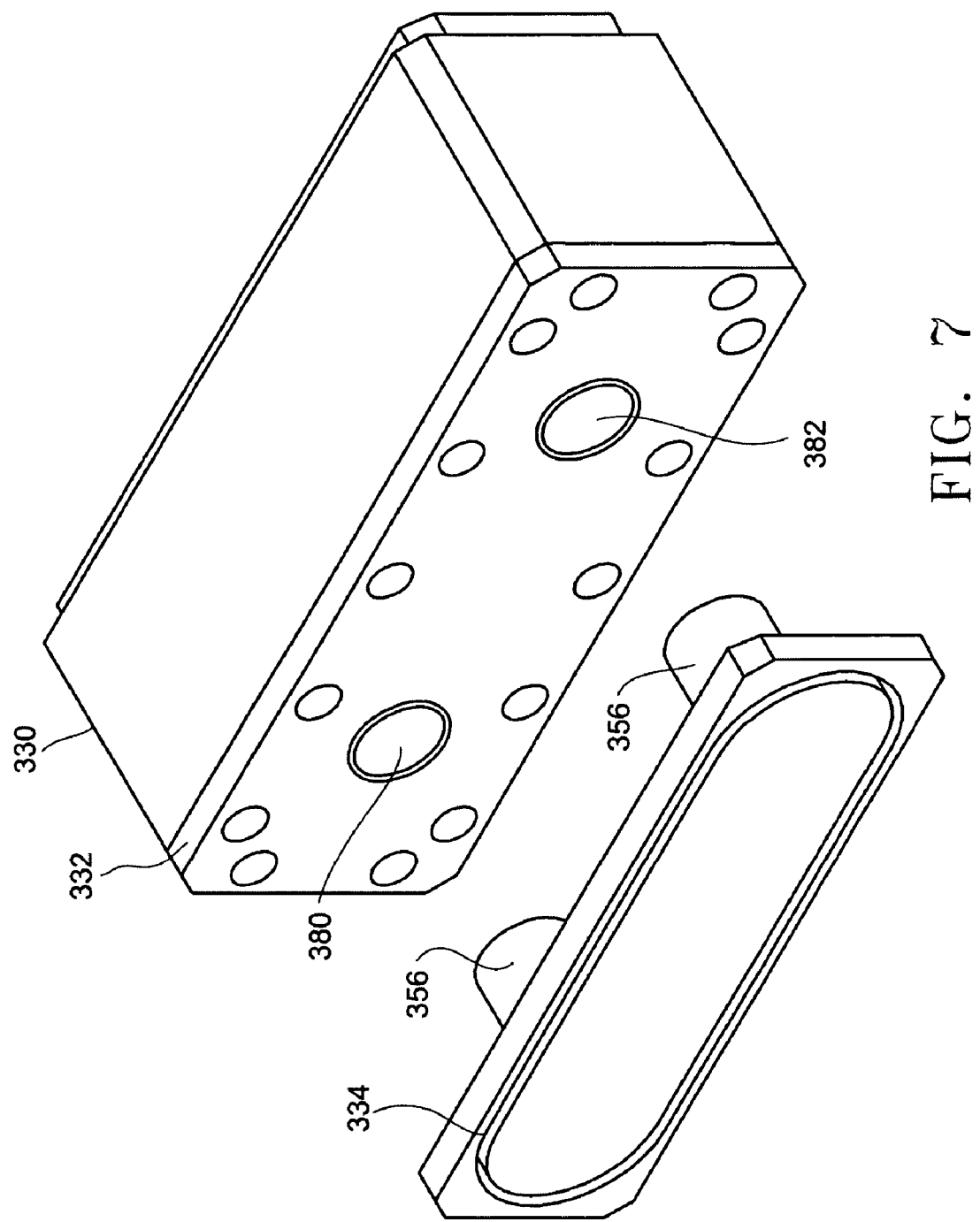
FIG. 7 shows a partially exploded view of the head assembly of the gate valve assembly, in accordance with an embodiment of the invention.

In one embodiment, the first piston 352 is configured as a dual-actuated twin-piston. As shown in FIG. 7, the closure plate 332 includes two piston pass-through 380 and 382, through which each of the twin pistons pass through. Similarly, in the illustrated embodiment, the second piston 354 is configured as a dual-actuated twin-piston. Although not shown in FIG. 7, head assembly housing 331 (FIG. 5) includes two piston pass-through on the opposite side of the closure plate 332, through which each of the twin pistons of the second piston 354 pass through. In this embodiment, the dual-actuated twin-pistons are better suited for applying even loads to the first and second doors 334 and 336, and resist twist loads that may occur due to dragging or sticking of the pistons passing thru the pass-through.

To configure the two pass-through piston design of the preferred embodiment requires two precisely located piston rod cylinders and two precisely located pass-through, or else rubbing will results and quick failure of the components. To minimize these tight machine tolerances, o-ring seals are added on the piston pass-through in both the closure plate 332 and the head assembly housing 331. These o-rings act to seal the pressure used for actuating the pistons 352 and 354. Preferably, the o-rings are integrated on the closure plate 332 of one set of pass-through and are integral on the head assembly housing 331 on the opposite side.

Figure 8:
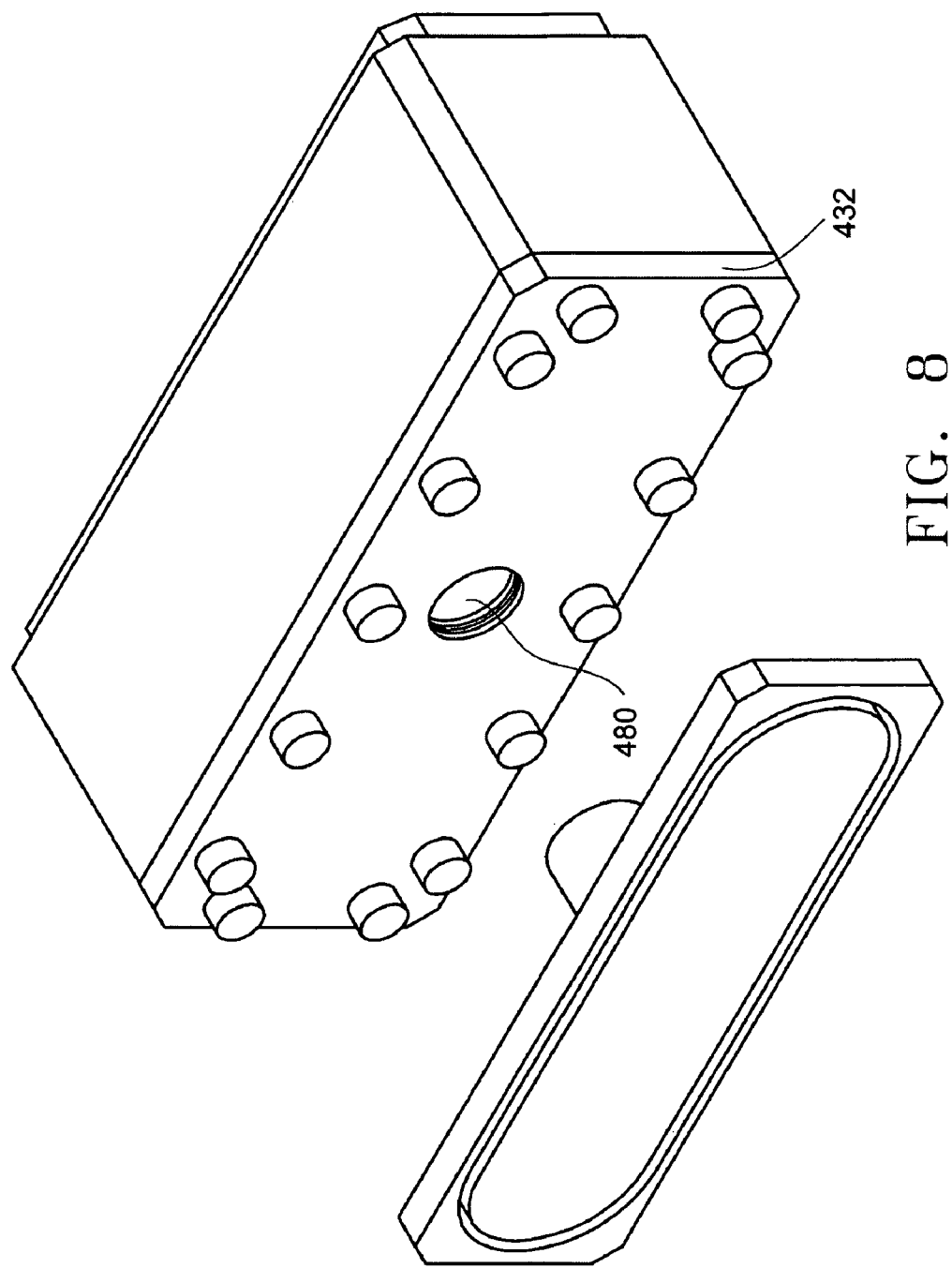
FIG. 8 shows a partially exploded view of the head assembly of the gate valve assembly, in accordance with an alternative embodiment of the invention.

In an alternative embodiment, the first piston 352 is configured as a single piston. As shown in FIG. 8, an alternative closure plate 432 includes a single pass-through 480, through which the single piston passes through. Similarly, in this alternative embodiment, the second piston 354 is configured as a single piston. Although not shown in FIG. 8, head assembly housing 331 includes one piston pass through in this alternative embodiment, through which the single piston of the second piston 354 passes through.

In another alternative embodiment, an oval pass-through with a length substantially equal to that of the first door 334 is configured within the closure plate. Similarly, an oval pass-through with a length substantially equal to that of the second door 336 is configured in the head assembly housing. In this alternative embodiment, very high bending loads in the first and second doors can be resisted by high applied process chamber pressures due to the tremendous increase in section modulus of the oval pass-through and corresponding oval pistons.

In yet another alternative embodiment, instead of the pass-thru rods simply going through the o-rings/holes in the head assembly/closure plate, a sleeve is configured to go in between the o-ring and the pass-through rods. The sleeve is either sealed on both ends with face seals at the end of the sleeve, with additional o-rings between the sleeve and the pass-through rods, or a combination of both techniques. The sleeves are sandwiched between the door at the piston and clamped by bolts running through the center of the piston rod pass-through. This technique allows the sleeve to "float" and self center during install, and allows for a much looser tolerance on location for the centerlines of the pass-through rods and the pass-through holes.

Further anticipated embodiments include the head assembly housing as an integral part of the process chamber design, instead of two different assemblies as shown herein. Also anticipated is a single piston design, instead of the two piston 352 and 354 design. In this case, the wall of the head assembly includes the o-ring door seal instead of the second door 336. This arrangement would cause a lever effect down the length of the up/down head cylinder 320 shaft during door movement, causing some problems for the attachment bolts if the head cylinder 320 is mounted firmly to the housing 310. The single piston design requires a floating arrangement between the head cylinder 320 and the housing 310, or some articulation in the head assembly 330 to up/down head cylinder 320 connection.

While the invention has been described in terms of specific embodiments incorporating details to facilitate the understanding of the principles of construction and operation of the invention, such reference herein to specific embodiments and details thereof is not intended to limit the scope of the claims appended hereto. It will be apparent to those skilled in the art that modifications may be made in the embodiments chosen for illustration without departing from the spirit and scope of the invention.

What is claimed is:

1. A double containment gate valve, the gate valve comprising:
    a housing comprising, a first access opening, a second access opening, and an inner chamber, wherein the first access opening is configured to be substantially in the same horizontal plane as the second access opening, thereby providing an access pass through the inner chamber of the double containment gate valve when the head assembly is in the down position, wherein the double containment gate valve is configured to allow a wafer to be loaded/unloaded to/from a processing chamber via the access path through the outer access opening and the inner access opening;
    a head assembly within the housing, wherein the head assembly is movable to concurrently form a first seal over the first access opening and a second seal over the second access opening, and configured such that a pressure exerted to open the second seal is translated to a pressure to maintain the first seal, wherein the head assembly is further configured to move down to clear the access path through the double containment gate valve and to minimize particulates during wafer loading and/or unloading, the head assembly includes a first door and a second door, the first door and the second door being movable in a direction parallel to the access path, wherein the head assembly further includes a head assembly housing and a closure plate, the head assembly housing being configured to form a head inner chamber, the closure plate being coupled to the head assembly housing at an open side of the head inner chamber, thereby enclosing the head inner chamber, wherein the head assembly further comprises a first piston and a second piston configured within the inner head chamber, the first piston being coupled to a first cylinder, wherein the first cylinder is coupled to the first door, the second piston being coupled to a second cylinder, wherein the second cylinder is coupled to the second door, and a fluid gap is configured between the first piston and the second piston; and
    a controller coupled to the gate valve and configured to compute a predicted process time for a substrate processed in the processing chamber and to employ the predicted process time to determine an operating state for the gate valve.

2. The double containment gate valve of claim 1, wherein fittings are coupled to access openings drilled into the head assembly housing, the fittings being configured to transmit pressure to a first outside face of the first piston and a second outside face of the second piston.

3. The double containment gate valve of claim 2, wherein one or more additional fittings are coupled to access openings leading to the fluid gap, wherein applying pressure to the first and second outside faces, and removing pressure from the fluid gap, moves the first and second pistons towards each other, and away from the first access opening and the second access opening.

4. The double containment gate valve of claim 2, wherein pressure supplied to the fluid gap between the first and second pistons and removed from the first and second outside faces causes the first and second pistons to be forced equally outward, thereby moving the first and second doors outwardly.

5. The double containment gate valve of claim 2, wherein a first surface of the first door facing the outer access opening includes a first o-ring and a surface of the second door facing the access opening includes a second o-ring.

6. The gate valve of claim 1, wherein the second access opening of the gate valve is coupled to a third access opening of a processing chamber.

7. The gate valve of claim 6, wherein when the head assembly is in a closed position, the head assembly seals closed the third access opening of the processing chamber and the first access opening of the gate valve.

8. The gate valve of claim 6, wherein the first, second, and third access openings form a substantially straight linear access path to the processing chamber.

9. The gate valve of claim 8, wherein the head assembly is movable in a direction perpendicular to the linear access path.

10. The gate valve of claim 8, wherein the head assembly includes first and second doors each movable in a direction of the access path, the first door facing and configured to seal the first access opening and the second door facing and configured to seal the second access opening.

11. The gate valve of claim 10, wherein the head assembly further comprises a first piston coupled to the first door, a second piston coupled to the second door, and a pressure cavity operatively coupling the first and second pistons.

12. The gate valve of claim 11, wherein the head assembly further comprises an access hole to the pressure cavity.

13. The gate valve of claim 11, wherein the first piston and the second piston each includes two-rod, double acting cylinders.

14. The gate valve of claim 11, wherein the first piston and the second piston each comprises a single cylinder.

15. The gate valve of claim 11, wherein the pressure cavity contains a material at a supercritical pressure.

* * * * *

UNITED STATES PATENT AND TRADEMARK OFFICE
CERTIFICATE OF CORRECTION

| | |
|---|---|
| PATENT NO. | : 7,494,107 B2 |
| APPLICATION NO. | : 11/094936 |
| DATED | : February 24, 2009 |
| INVENTOR(S) | : Sheydayi et al. |

Page 1 of 1

It is certified that error appears in the above-identified patent and that said Letters Patent is hereby corrected as shown below:

<u>TITLE PAGE 4, ITEM 56 REFERENCES</u>

Please replace reference "EP 8-252549 10/1996" with "JP 8-252549 10/1996" so that the corresponding sentence reads

-- JP   8-252549    10/1996 --

Signed and Sealed this

Twelfth Day of May, 2009

JOHN DOLL
*Acting Director of the United States Patent and Trademark Office*